(12) United States Patent
Chilappagari et al.

(10) Patent No.: US 10,587,288 B1
(45) Date of Patent: Mar. 10, 2020

(54) SYSTEMS AND METHODS FOR ITERATIVE CODING OF PRODUCT CODES IN NAND FLASH CONTROLLERS

(71) Applicant: Marvell International Ltd., Hamilton (BM)

(72) Inventors: Shashi Kiran Chilappagari, San Jose, CA (US); Phong Sy Nguyen, Ho Chi Minh (VN)

(73) Assignee: Marvell International Ltd., Hamilton (BM)

( * ) Notice: Subject to any disclaimer, the term of this patent is extended or adjusted under 35 U.S.C. 154(b) by 353 days.

(21) Appl. No.: 15/173,137

(22) Filed: Jun. 3, 2016

Related U.S. Application Data

(60) Provisional application No. 62/170,935, filed on Jun. 4, 2015.

(51) Int. Cl.
*H03M 13/29* (2006.01)
*G06F 11/10* (2006.01)
*G11C 29/52* (2006.01)
*H03M 13/45* (2006.01)

(52) U.S. Cl.
CPC ..... *H03M 13/2948* (2013.01); *G06F 11/1068* (2013.01); *G11C 29/52* (2013.01); *H03M 13/45* (2013.01)

(58) Field of Classification Search
CPC ... H04L 1/0009; H04L 1/0057; H04L 1/0041; H04L 1/0071; H03M 13/35; H03M 13/2948; H03M 13/45; G06F 11/1068; G11C 29/52

USPC ......................................................... 714/774
See application file for complete search history.

(56) References Cited

U.S. PATENT DOCUMENTS

| | | | | |
|---|---|---|---|---|
| 6,272,659 B1 * | 8/2001 | Zook | ................. | H03M 13/1515 714/763 |
| 7,590,920 B2 * | 9/2009 | Yang | ..................... | H03M 13/29 714/774 |
| 8,046,660 B2 * | 10/2011 | Wu | ........................ | G11C 29/52 714/755 |
| 8,156,400 B1 * | 4/2012 | Yeo | ....................... | H03M 5/145 714/758 |
| 8,156,409 B2 * | 4/2012 | Patapoutian | ......... | H03M 13/112 375/340 |
| 8,291,298 B2 * | 10/2012 | Lo | ..................... | H03M 13/6597 714/774 |

(Continued)

*Primary Examiner* — Albert Decady
*Assistant Examiner* — Enam Ahmed

(57) ABSTRACT

Systems and methods for decoding a product code is provided. The system comprises a media, a first buffer, a second buffer, and a decoder. The media stores a plurality of codewords of a first code of the product code. The first buffer temporarily stores at least one codeword that has failed to be decoded. The second buffer temporarily stores soft information to be used in decoding. The decoder is configured to decode the plurality of codewords, determine if a first count of the at least one failed codeword exceeds a designed maximum number of codewords recoverable using the decoding method. In response to determining that the first count does not exceed the predefined threshold, the decoder iteratively process each failed codeword of the at least one failed codeword with the soft information, and attempt to decode at least one of each failed codeword that has been iteratively processed.

22 Claims, 14 Drawing Sheets

(56) References Cited

U.S. PATENT DOCUMENTS

| | | | | |
|---|---|---|---|---|
| 8,321,769 B1* | 11/2012 | Yeo | ............... | H03M 13/2918 |
| | | | | 714/785 |
| 8,627,183 B1* | 1/2014 | Chen | ............ | H03M 13/2909 |
| | | | | 714/758 |
| 8,667,361 B1 | 3/2014 | Varnica et al. | | |
| 8,788,910 B1* | 7/2014 | Northcott | .......... | G06F 11/1012 |
| | | | | 714/763 |
| 8,996,957 B1* | 3/2015 | Northcott | .......... | G06F 11/1012 |
| | | | | 714/763 |
| 9,160,373 B1* | 10/2015 | Varnica | ............ | H03M 13/2909 |
| 2006/0020874 A1* | 1/2006 | Desai | .............. | H03M 13/2963 |
| | | | | 714/780 |
| 2010/0192040 A1* | 7/2010 | Yedidia | ............ | H03M 13/1108 |
| | | | | 714/755 |
| 2012/0119928 A1* | 5/2012 | Yang | ............... | G06F 11/1012 |
| | | | | 341/94 |
| 2013/0114759 A1* | 5/2013 | Buckley | ................ | H04L 27/04 |
| | | | | 375/295 |
| 2014/0229792 A1 | 8/2014 | Varnica et al. | | |
| 2014/0310571 A1* | 10/2014 | Fetterly | ............ | G06F 11/1088 |
| | | | | 714/764 |
| 2016/0034728 A1* | 2/2016 | Oliver | ............... | G06K 7/10257 |
| | | | | 340/10.1 |
| 2016/0080004 A1* | 3/2016 | Yamaki | ............ | H03M 13/458 |
| | | | | 714/764 |
| 2016/0266968 A1* | 9/2016 | Torii | ................. | G06F 11/1068 |
| 2016/0266972 A1* | 9/2016 | Yamaki | ............... | H03M 13/45 |

* cited by examiner

SYSTEMS AND METHODS FOR ITERATIVE CODING OF PRODUCT CODES IN NAND FLASH CONTROLLERS

CROSS REFERENCE TO RELATED APPLICATION

This claims the benefit of commonly-assigned U.S. Provisional Patent Application No. 62/170,935, filed Jun. 4, 2015, which is incorporated by reference herein in its entirety.

FIELD OF USE

Implementations of the subject matter of this disclosure generally pertain to apparatus and methods for utilizing product codes to recover failed memory units. In particular, implementations of the subject matter of this disclosure pertain to apparatus and methods for data recovery in FLASH controllers.

BACKGROUND

The background description provided herein is for the purpose of generally presenting the context of the disclosure. Work of the inventors hereof, to the extent the work is described in this background section, as well as aspects of the description that may not otherwise qualify as prior art at the time of filing, are neither expressly nor impliedly admitted to be prior art against the present disclosure.

Memory systems are susceptible to errors and failures. For example, some or all of the data stored on a particular allocation unit (AU) on a FLASH may become corrupted or otherwise inaccessible. Absent an appropriate error correction mechanism, a memory controller may not be able to recover the lost data. To alleviate this problem, the memory controller may introduce error correcting capabilities in the coding process, such as by encoding the data with an error correcting code (ECC) to make use of redundancy in order to correct errors.

However, the error correcting capability of a given ECC is limited by the amount of redundant bits allowable in the system. As the number of memory failures (or errors) increases, it becomes computationally and spatially expensive to keep adding redundancy to the ECC scheme.

SUMMARY

In order to increase the success rate of decoding in a product code, existing soft information as represented by the parity data bits must be used to the fullest extent. One way of doing so is to implement a redundant array of independent drives (RAID) system to encode and decode product codes. The present invention discloses systems and methods for encoding and decoding codewords using a soft RAID system in order to maximize data recovery success rate with existing hardware. It is the further intent of the present invention to provide illustrative hardware implementations for these encoding and decoding methods.

According to some implementations of the present invention, a system for decoding a product code, which contains a media, a first buffer, a second buffer, and a decoder, is provided. The media is configured to store a plurality of codewords of a first code of the product code. The first buffer is configured to buffer at least one codeword that failed to be decoded. The second buffer is configured to store soft information. The decoder is configured to decode the plurality of codewords; determine if a first count of the at least one failed codeword exceeds a predefined threshold; and iteratively process each failed codeword of the at least one of each failed codeword with the soft information. The decoder is further configured to decode at least one of each failed codeword that has been iterative processed.

In some embodiments, the soft information is updated based on a second code of the product code. In some embodiments, the soft information is updated either only once at the beginning of the iterative processing of the at least one failed codeword, or each time one of the at least one failed codeword is successfully decoded.

In some embodiments, the decoder is further configured to successfully decode at least one of each failed codeword that has been iteratively processed to produce a decoded codeword, and update the soft information with at least one of each failed codeword that has been iteratively processed. In some embodiments, the decoder is further configured to update the soft information with the decoded codeword.

In some further embodiments, the at least one of each failed codeword that has been iteratively processed is successfully decoded based on a decoding rule. In some embodiments, the decoder is further configured to attempt to decode subsequent codewords of the at least one failed codeword that has been iteratively processed based on the decoding rule.

In some embodiments, the each failed codeword of the at least one failed codeword is iteratively processed in a serial fashion. In some embodiments, the decoder is further configured to determine a second count of failed codewords that failed to be decoded after one complete iteration of the at least one failed codeword; iteratively process each failed codeword of the second count of failed codewords with the soft information; and attempt to decode each processed codeword of the second count of failed codewords.

In some further embodiments, the predefined threshold is a designed maximum number of failures that are recoverable with the decoding method in accordance with the present invention.

BRIEF DESCRIPTION OF THE DRAWINGS

Further features of the disclosure, its nature and various advantages, will be apparent upon consideration of the following detailed description, taken in conjunction with the accompanying drawings, in which like reference characters refer to like parts throughout, and in which.

DETAILED DESCRIPTION

As noted above, memory systems are susceptible to errors and failures. In memory systems that implement error correction, an allocation unit (AU) refers to a specifically-formatted data block that the error correction circuitry treats as an individual unit. For example, the error correction circuitry may process an AU encoded using a low density parity check (LDPC) code or a single parity check (SPC) code. The LDPC code is a state-of-the-art error correcting scheme that typically uses iterative decoding to recover errors. The SPC code typically generates a single parity by XORing ("exclusive-OR", also denoted by the symbol "^") every bit in an information sequence. The LDPC code and the SPC code are examples of error correction codes (ECC), which are used in the present disclosure for illustration and ease of discussion. However, they are not meant to limit the scope of the present disclosure.

Figure 1:
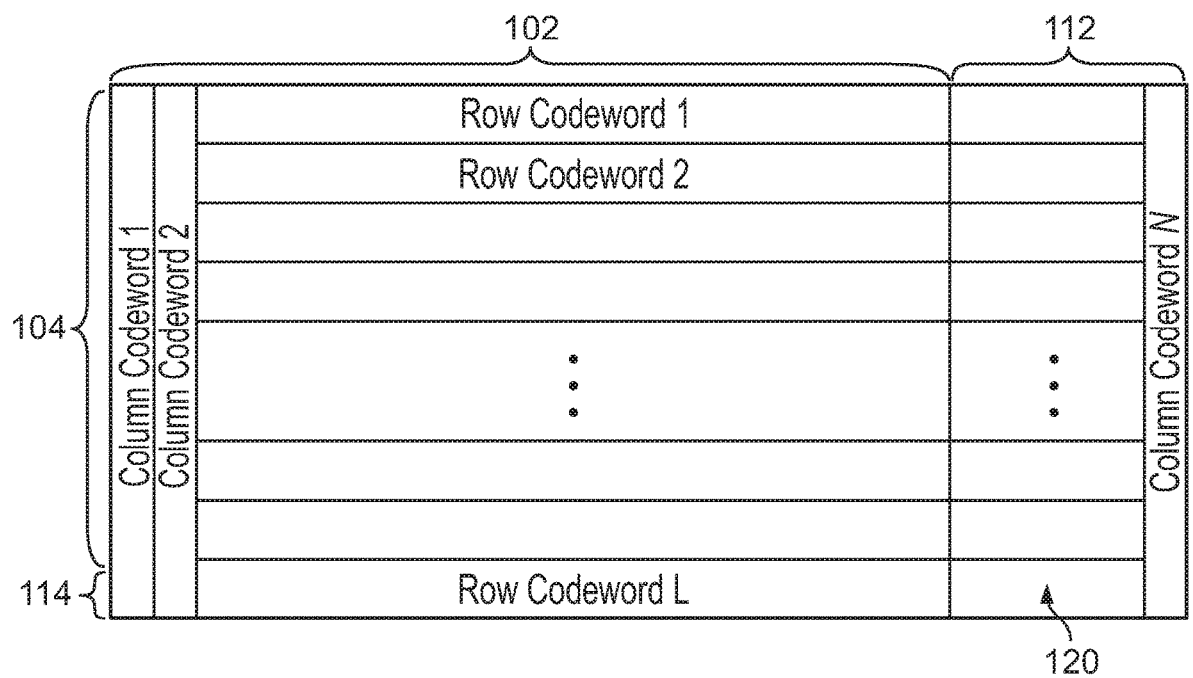
FIG. 1 shows a representation of a product code, which may be used in accordance with the subject matter of this disclosure.

FIG. 1 shows a representation of a product code. A product code is typically constructed with a row code and a column code. In particular, a linear product code is typically constructed with a linear row code and a linear column code. As illustrated in FIG. 1, a row codeword of the row code comprises a row code user data portion 102 and a row code parity data portion 112. Similarly, a column codeword of the column code comprises a column code user data portion 104 and a column code parity data portion 114. The product code of FIG. 1 can be constructed from L row-codewords and N column-codewords. Parity on parity 120 can be obtained in two ways—either by row-encoding the column code parity data portion 114, or by column-encoding the row code parity data portion 112. In an exemplary embodiment of the present disclosure, the row code may be an LDPC code and the column code may be an SPC code.

Figure 2:
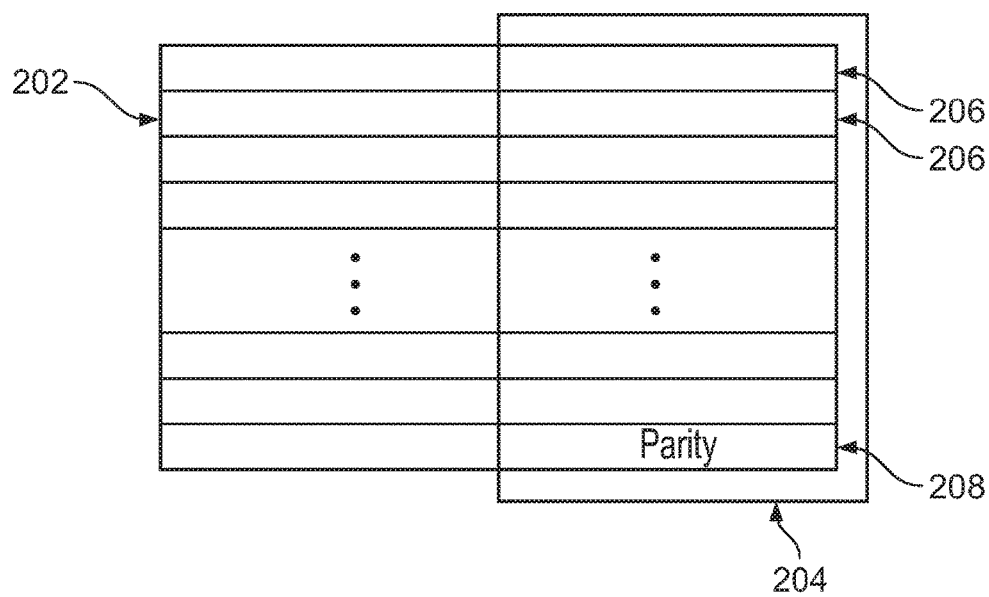
FIG. 2 shows a representation of a RAID implementation of a memory, which may be used in accordance with the subject matter of this disclosure.

In addition to using ECC on information bits, a FLASH controller may also recover memory failures with RAID techniques, which have traditionally been used in hard-disk drives (HDDs) for recovery of disk failures. Although FLASH systems do not implement disks drives, they can still benefit from similar techniques within a FLASH memory. FIG. 2 shows an illustration of a RAID configuration for a FLASH system in accordance with an embodiment of the present disclosure.

The FLASH system in FIG. 2 is divided into pages, each page comprising one or more AUs depending on the relative sizes of pages and AUs defined for the particular FLASH system. Each AU, in turn, may contain one or more codewords as used in FIG. 1. For instance, a 16 KiB page 202 may comprise four AUs, each of 4 KiB in size, and each AU may contain four 1 KiB codeword. In FLASH systems, a page is the smallest unit that can be read or written at a time. Accordingly, AUs within the same page are always read and written together, and they experience similar levels of memory wear.

In one implementation of the RAID architecture, a k/k+1 RAID stripe 204 may comprise k "user" AUs 206 across different pages (even different memory devices) and one "parity" AU 208, the latter of which may be obtained by XORing all k "user" AUs 206. As their names suggest, a "user" AU stores actual user data and a "parity" AU stores parity data. The k "user" AUs 206, being from different pages, may be of varying quality due to the different levels of memory wear that they experience. In principle, if one of the k "user" AUs 206 failed to decode during a memory read, standard RAID operations can recover that failed AU by XORing the remaining (k−1) "user" AUs with the "parity" AU 208.

The above-described RAID configuration of FIG. 2 corresponds with the product code structure as illustrated in FIG. 1. Particularly, the "parity" AU 208 can be obtained by performing an SPC encoding operation on the user data portion 104 of a column codeword (i.e., the k "user" AUs 206). Together, the k "user" AUs 206 and the "parity" AU 208 may form a complete column codeword, which corresponds to RAID stripe 204. Meanwhile, each AU of the (k+1) "user" or "parity" AUs may be further encoded by a row code, such as an LDPC code. The row code operation on the "user" or "parity" AUs and the column code operation on RAID stripe 204 collectively produce a product code, in accordance with the illustration as shown in FIG. 1. Note that, for the present disclosure, the row code operation can occur either before or after the column code operation. For example, the LDPC encoding of each individual AU can occur either before or after the SPC encoding of all (k+1) AUs (i.e., the RAID stripe).

However, the RAID process, as explained above, is limited to recovery of only a single failed AU. In the present disclosure, a soft RAID system (softRAID) is provided for recovering 2 or more failed AUs using the existing product code architecture as implemented on the RAID configuration of FLASH systems. The softRAID system disclosed herein requires minimal computational resources because its encoder shares many operations that are currently performed in the standard RAID encoding procedure. In addition, the softRAID system disclosed herein can be configured to operate with either hard information or soft information (or both) which are readily available from the product code of FIG. 1. Exemplary decoders for the softRAID system disclosed herein can follow the low-complexity bit-flipping decoding methods as introduced in U.S. Pat. No. 8,667,361, filed Oct. 19, 2011, issued Mar. 4, 2014 and in U.S. Patent Application Publication No. 2014/0229792, filed Feb. 4, 2014, published Aug. 14, 2014, the disclosure of each of which is herein incorporated by reference in its respective entirety.

Figure 3:
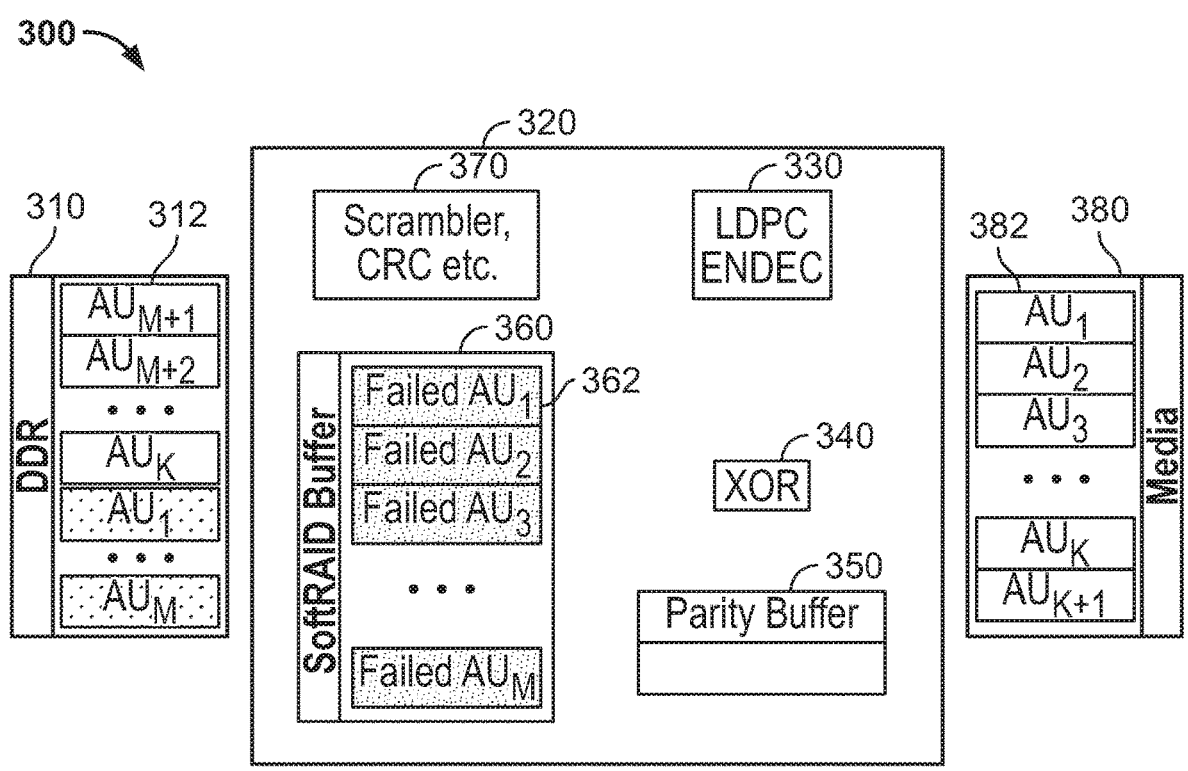
FIG. 3 shows a schematic representation of a coding system for a memory device based on product codes, which incorporates implementations of the subject matter of this disclosure.

FIG. 3 shows a schematic representation of a coding system for a memory device based on product codes in accordance with some embodiments of the present disclosure. Coding system 300 includes double data rate storage (DDR) 310, softRAID 320, and media 380. In some embodiments, DDR 310 may be a DDR, DDR2, DDR3, or DDR4 SDRAM memory or any other suitable implementation of random access memories. Unencoded allocation units $AU_1 \ldots AU_k$ 312 are initially stored in DDR 310. In some embodiments, media 380 may be a NAND FLASH or any other suitable type of solid-state drives. Encoded allocation units $AU_1 \ldots AU_{k+1}$ 382 are stored in media 380. Lastly, softRAID 320 comprises LDPC encoding-decoding block 330, a simple XOR block 340, a parity buffer 350, an softRAID buffer 360, and other circuitry (such as scrambler, cyclic redundancy check, etc.) collectively labeled as optional circuitry 370. The softRAID buffer 360 can store data of up to m failed AUs, where m is a maximum number of failed AUs that the system disclosed herein can recover by design. In some embodiments, parity buffer 350 may be a RAID parity buffer for use in generating and retrieving RAID parity AUs.

Coding system 300 may use iterative decoding to take advantage of the product code structure, such as the one illustrated in FIG. 1, to recover more than one failed AU. The iterative decoding process will be explained in further detail below in relation to FIGS. 6A-6E and 7A-7E, in accordance with some embodiments of the present disclosure. However, to understand the operation of coding system 300, an encoding process is provided in the schematic representations of FIGS. 4A-4E and 5A-5E in accordance with some embodiments of the present disclosure. FIGS. 4A-4E, 5A-5E, 6A-6E, and 7A-7E contain similar circuit components as FIG. 3, where similar reference characters are used to indicate similar components. For instance, parity buffer 350 in FIG. 3 may, in some embodiments, be identical to parity buffer 450 of FIGS. 4A-4E, parity buffer 550 of FIGS. 5A-5E, parity buffer 650 of FIGS. 6A-6E, and parity buffer 750 of FIGS. 7A-7E. In addition, for consistency with prior examples, the system disclosed herein assumes that there are k "user" AUs and one "parity" AU in a RAID stripe, and that m is the designed maximum number of decoding failures recoverable in the coding systems of FIGS. 4A-4E, 5A-5E, 6A-6E, and 7A-7E.

Two encoding schemes are illustrated below. The first encoding scheme is shown in FIGS. 4A-4E, whereby the column SPC code is encoded before the row LDPC code. In the second encoding scheme in FIGS. 5A-5E, the order is reversed, whereby the row LDPC code is encoded before the column SPC code.

Figure 4A:
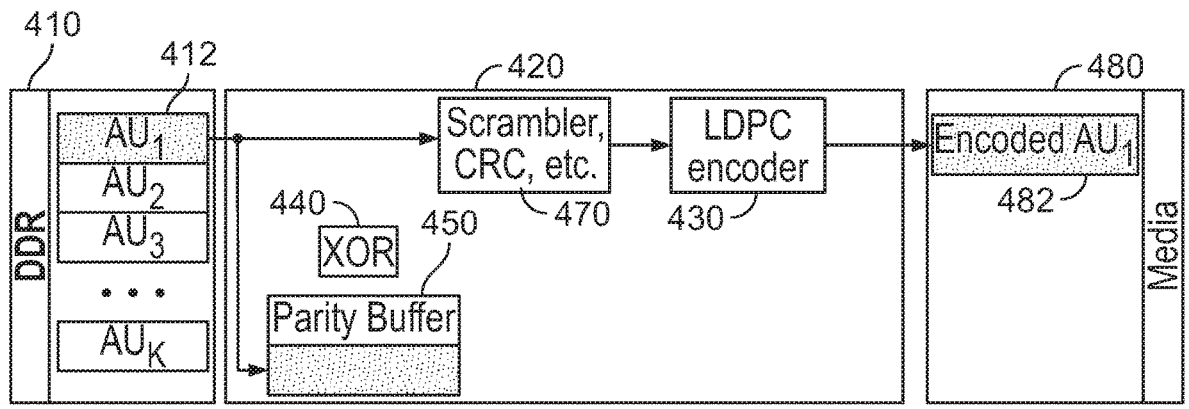
FIGS. 4A-4E show schematic representations of a coding system such as that of FIG. 3, which encodes information based on product codes in accordance with some implementations of the subject matter of this disclosure.

In FIG. 4A, unencoded allocation units $AU_1$, $AU_2$, $AU_3$ ..., $AU_k$ are stored in DDR 410. Unencoded $AU_1$ 412 is first transferred from DDR 410 to parity buffer 450 and optional circuitry 470 of softRAID 420. In parity buffer 450, the unencoded $AU_1$ 412 is stored temporarily. In optional circuitry 470, optional data processing such as data scrambling and cyclic redundancy check encoding may be performed on the unencoded $AU_1$ 412. Thereafter, in an exemplary embodiment, LDPC encoder 430 may row-encode the processed $AU_1$ 412 into an LDPC codeword (i.e., an encoded AU), before writing the encoded $AU_1$ 482 into media 480.

Figure 4B:
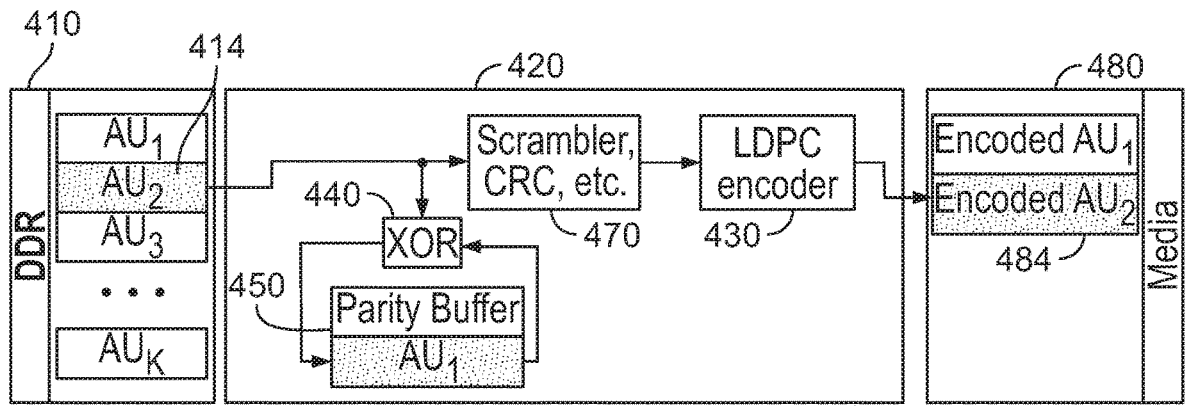

In FIG. 4B, unencoded $AU_2$ 414 is first transferred to XOR block 440 to be XOR'ed with the data stored in parity buffer 450. The result of the XOR operation, i.e., $AU_1 \hat{} AU_2$, may then be passed back to parity buffer 450 and stored there, as will be shown in FIG. 4C. This XOR operation corresponds to the column-encoding operation of the product code as illustrated in FIG. 1, where, for example, a parity AU of an SPC code, $AU_{k+1}$, is be generated. The unencoded AU2 414 may also be processed in optional circuitry 470 and be row-encoded by LDPC encoder 430 into encoded $AU_2$ 484, following the similar process in FIG. 4A.

Figure 4C:
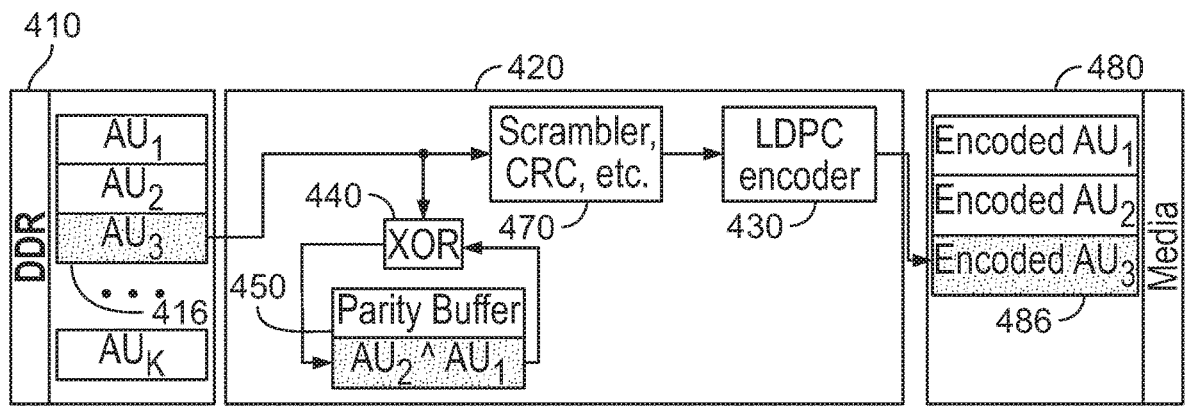
Figure 4D:
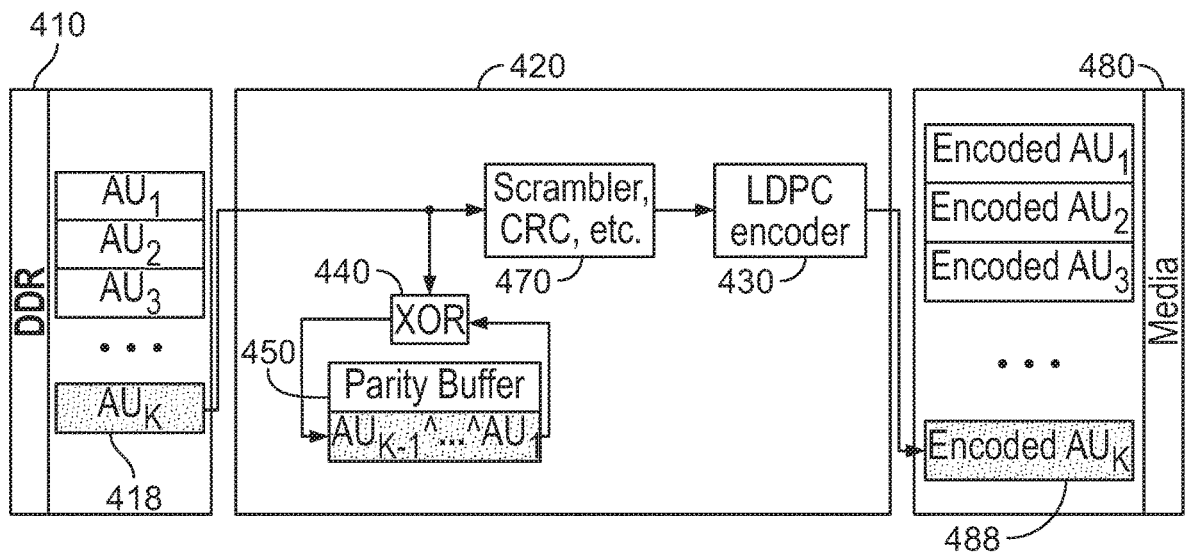
Figure 4E:
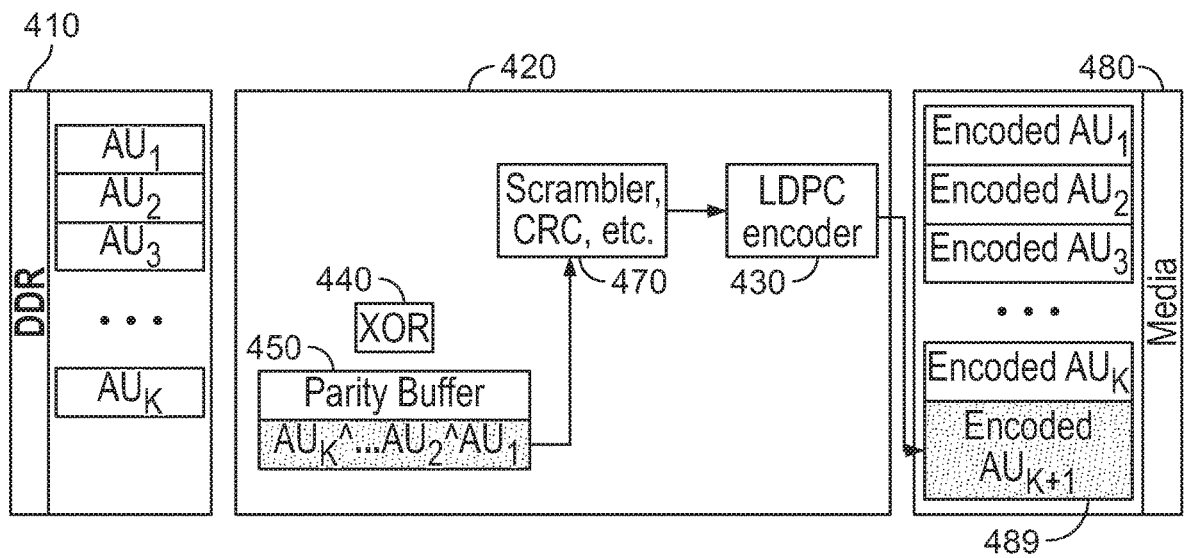

In FIG. 4C, as before, unencoded $AU_3$ 416 is XOR'ed to update the parity data stored in parity buffer 450, and then row-encoded by LDPC encoder 430 into encoded $AU_2$ 486. In FIG. 4D, the above process is repeated until the last unencoded $AU_k$ 418 is row-encoded by LDPC encoder 430 into encoded $AU_k$ 488. As illustrated, parity buffer 450, at the start of the encoding of $AU_k$ 418, contains the parity value of $AU_{k-1} \hat{} AU_{k-2} \hat{} \ldots \hat{} AU_1$. Lastly, FIG. 4E shows the state of parity buffer 450 at the end of the encoding of $AU_k$ 418, which contains the value of $AU_k \hat{} \ldots \hat{} AU_2 \hat{} AU_1$. Similar to the row-encoding process illustrated above, optional circuitry 470 may further process the parity data from parity buffer 450 before LDPC encoder 430 encodes the parity data into encoded $AU_{k+1}$ 489, which is stored in media 480. At the end of the encoding process, media 480 will contain encoded $AU_1$ through encoded $AU_{k+1}$, and parity buffer 450 may be reset.

Figure 5A:
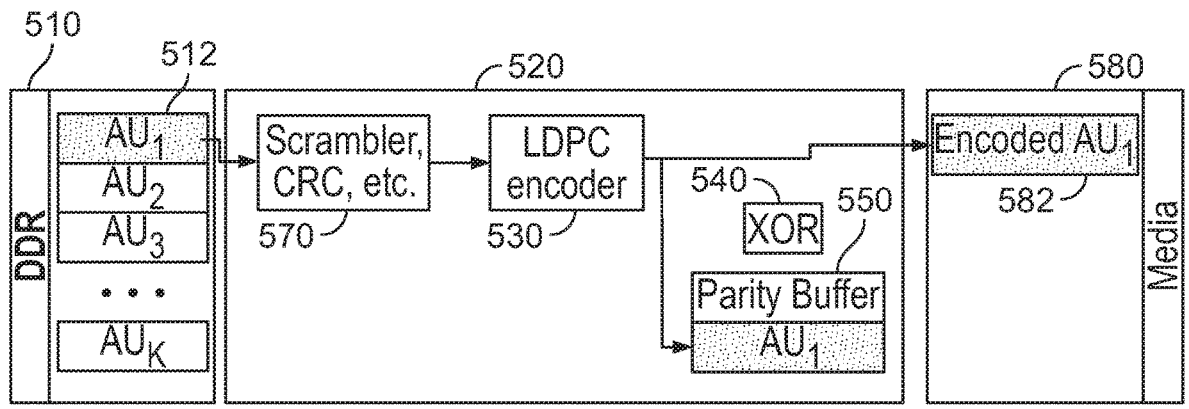
FIGS. 5A-5E show schematic representations of a coding system such as that of FIG. 3, which encodes information based on product codes in accordance with some other implementations of the subject matter of this disclosure.

FIGS. 5A-5E illustrate the alternative scheme, in which the column encoding using SPC code is performed after the row LDPC encoding process. In FIG. 5A, similar to the set-up in FIG. 4A, unencoded allocation units $AU_1$, $AU_2$, $AU_3$ ..., $AU_k$ are stored in DDR 510. Unencoded $AU_1$ 512 is first transferred from DDR 510 to optional circuitry 570 of softRAID 520, where optional data processing such as data scrambling and cyclic redundancy check encoding may be performed. Thereafter, in an exemplary embodiment, LDPC encoder 530 may row-encode the processed $AU_1$ 512 into an LDPC codeword (i.e., encoded $AU_1$), before writing the encoded $AU_1$ 582 into media 580. LDPC encoder 530 may additionally write a copy of the encoded $AU_1$ to RAID parity buffer 550.

Figure 5B:
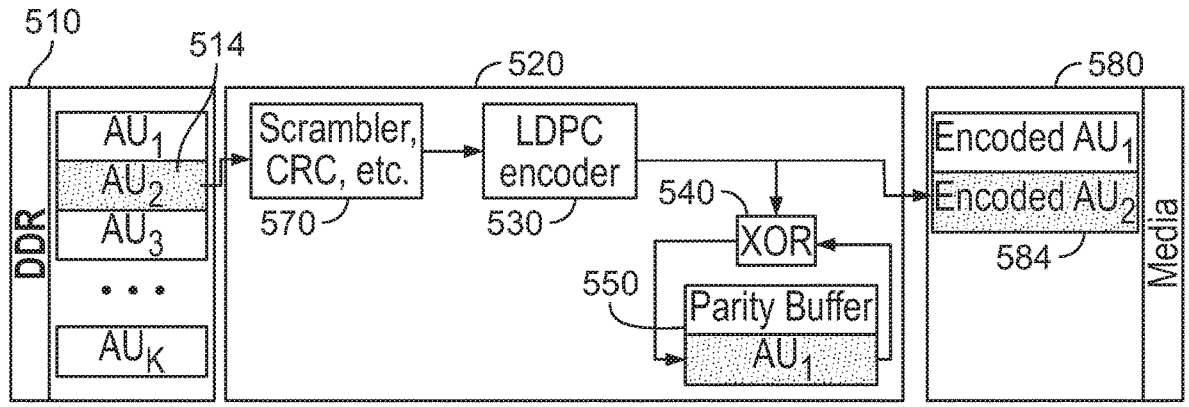

In FIG. 5B, unencoded $AU_2$ 514, after being transferred from DDR 510 to optional circuitry 570, is row-encoded by LDPC encoder 530 into encoded $AU_2$ 584. The encoded $AU_2$ 584 may also be passed to simple XOR block 540 to be XOR'ed with the data stored in parity buffer 550. The result of the XOR operation, i.e., $AU_1 \hat{} AU_2$, may then be passed back to parity buffer 550 and stored there, as will be shown in FIG. 5C. This XOR operation corresponds to the column-encoding operation of the product code as illustrated in FIG. 1, where, for example, a parity AU of an SPC code, $AU_{k+1}$, is be generated.

Figure 5C:
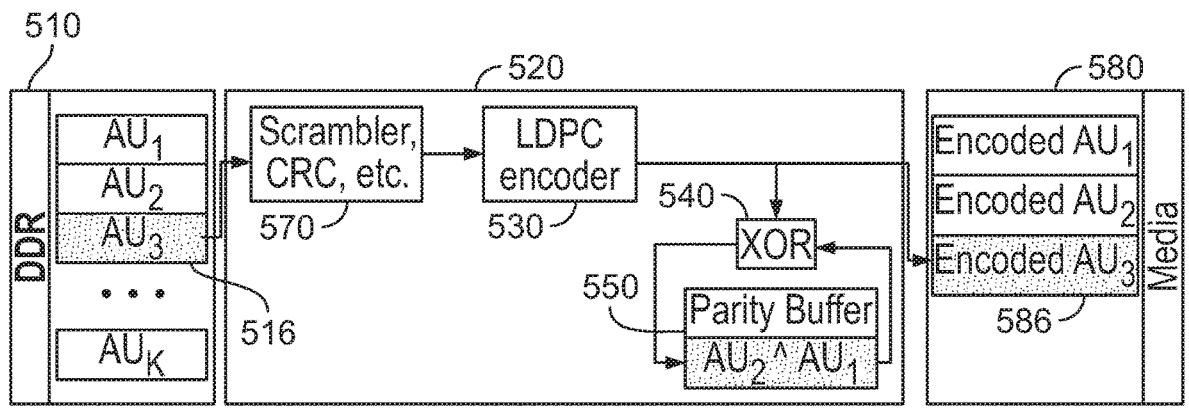
Figure 5D:
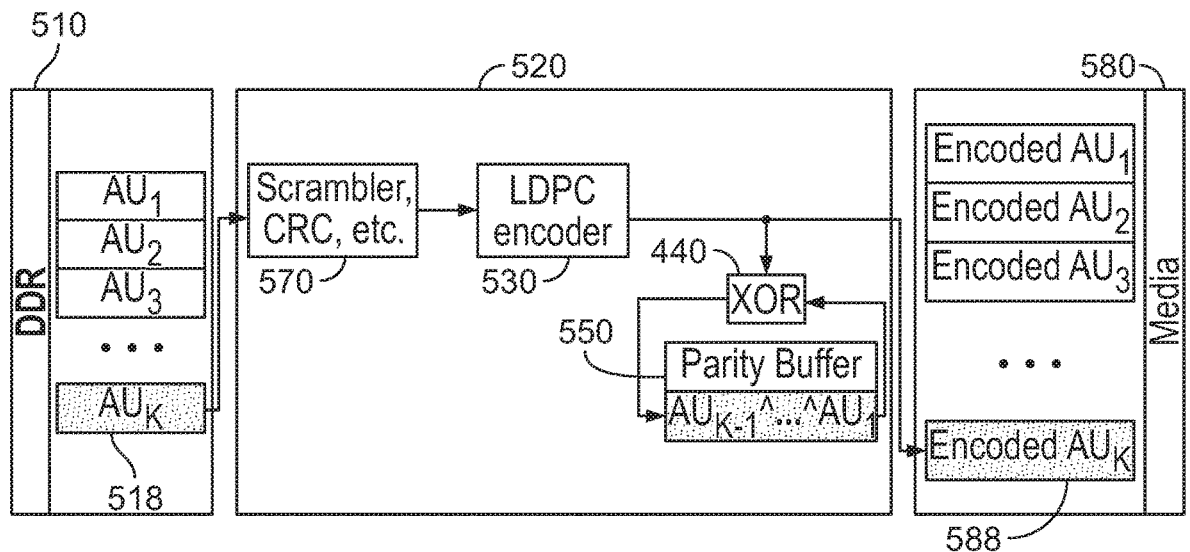
Figure 5E:
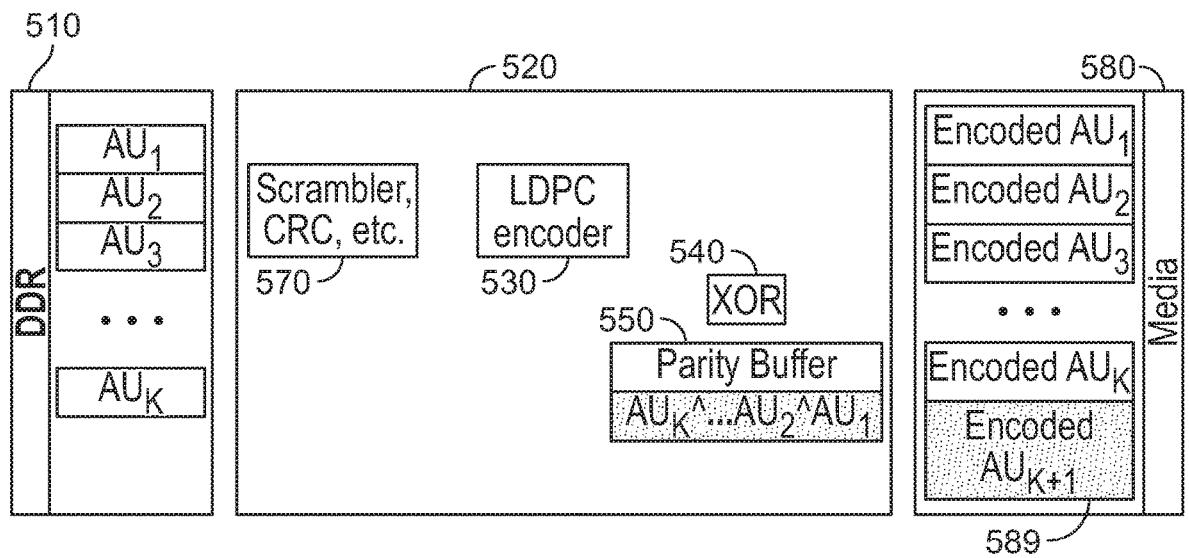

In FIG. 5C, as before, unencoded $AU_3$ 516 is row-encoded by LDPC encoder 530 into encoded $AU_2$ 586, which is then XOR'ed to update the parity data stored in parity buffer 550. In FIG. 5D, the above process is repeated until the last unencoded $AU_k$ 518 is row-encoded by LDPC encoder 530 into encoded $AU_k$ 588. As illustrated, parity buffer 550, at the start of the encoding of $AU_k$ 518, contains the parity value of $AU_{k-1} \hat{} AU_{k-2} \hat{} \ldots \hat{} AU_1$. Lastly, FIG. 5E shows the state of parity buffer 550 at the end of the encoding of $AU_k$ 518, which contains the value of $AU_k \hat{} \ldots \hat{} AU_2 \hat{} AU_1$. Coding system 300 copies the parity data from parity buffer 550 into media 580 as encoded $AU_1$ 589. At the end of the encoding process, media 580 will contain encoded $AU_1$ through encoded $AU_{k+1}$, and parity buffer 550 may be reset.

Turning to the decoding process—in FIGS. 6A-6E and 7A-7E, schematic representations of coding system 300 performing decoding operations are shown and described in accordance with some embodiments of the present disclosure. FIGS. 6A-6E illustrate a decoding process that is counterpart to the encoding process in FIGS. 4A-4E; and FIGS. 7A-7E illustrate a decoding process counterpart to the encoding process in FIGS. 5A-5E.

Figure 6A:
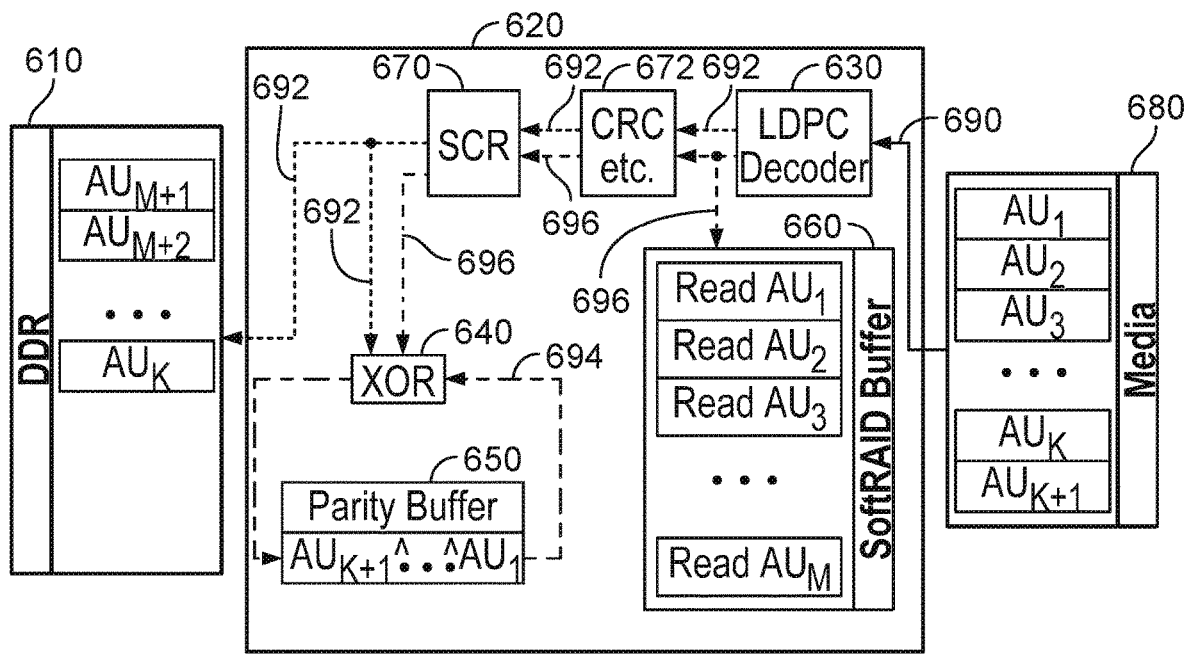
FIGS. 6A-6E show schematic representations of a coding system such as that of FIG. 3, which decodes codewords based on product codes in accordance with some implementations of the subject matter of this disclosure.
Figure 6B:
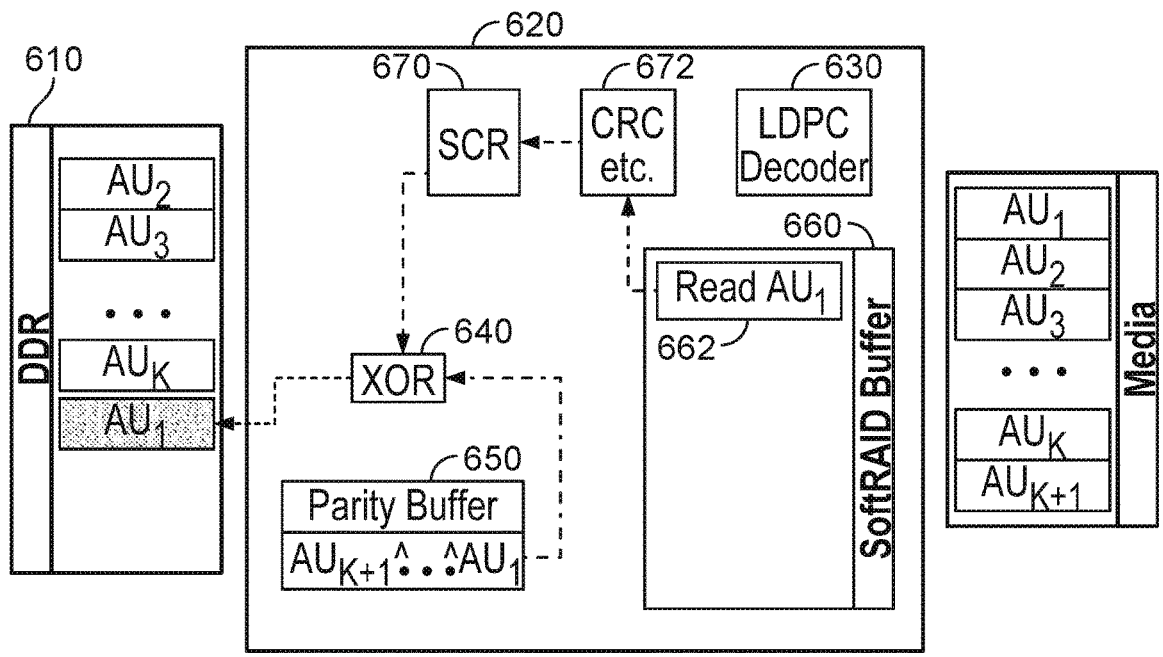
Figure 6C:
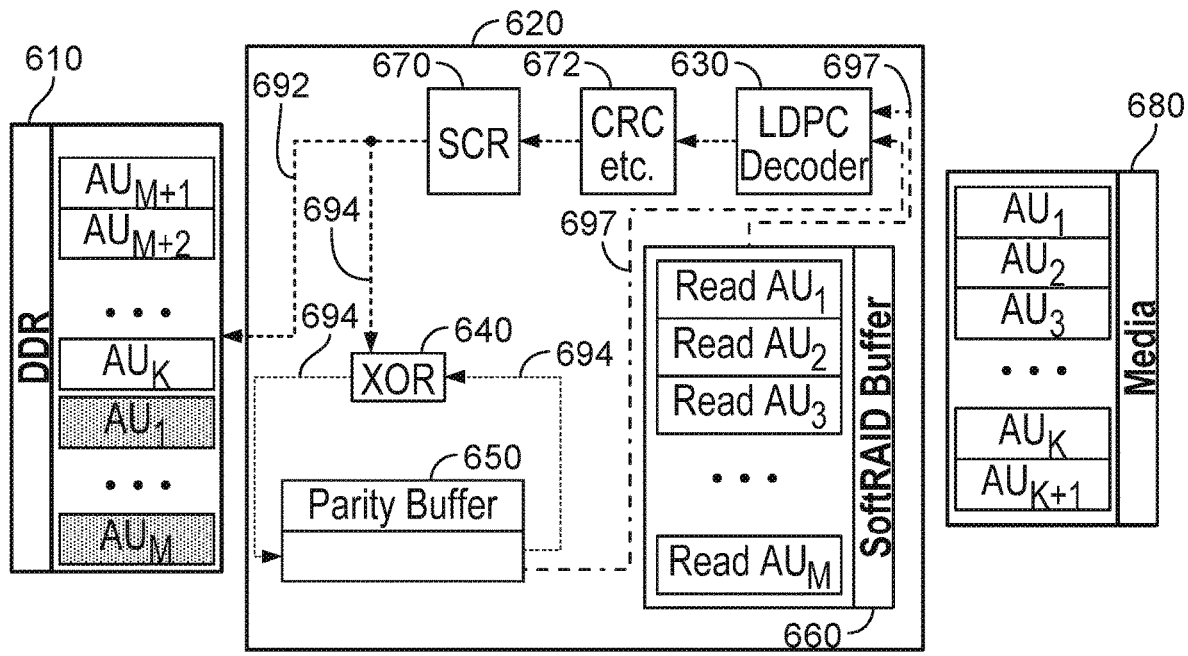
Figure 6D:
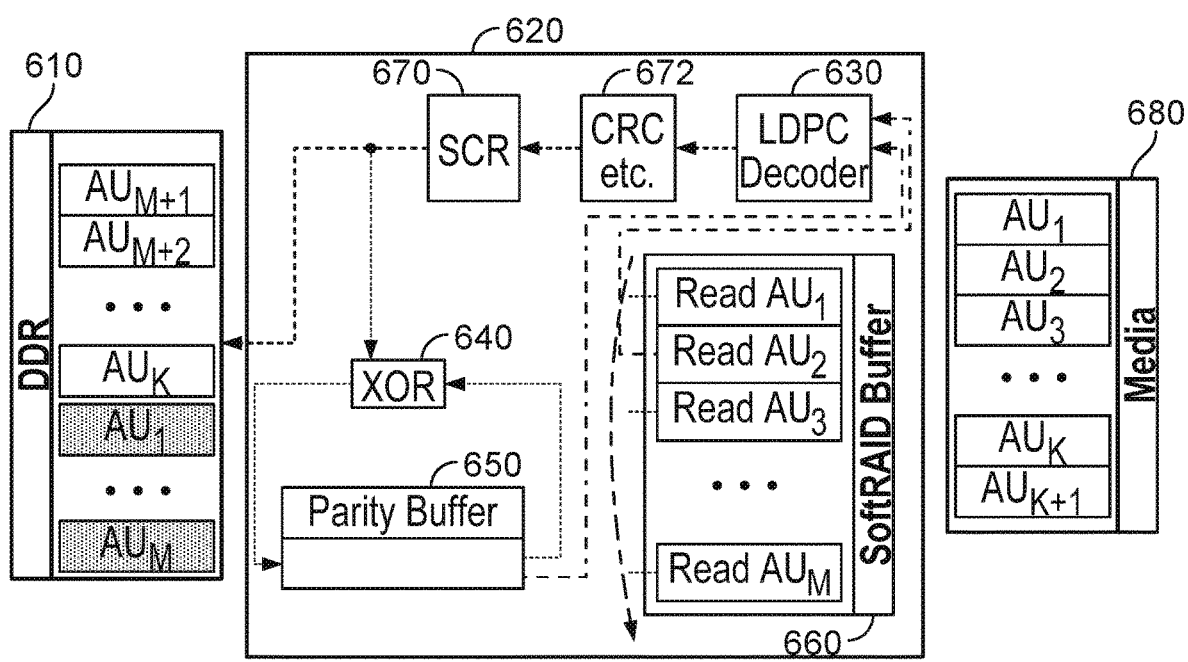
Figure 6E:
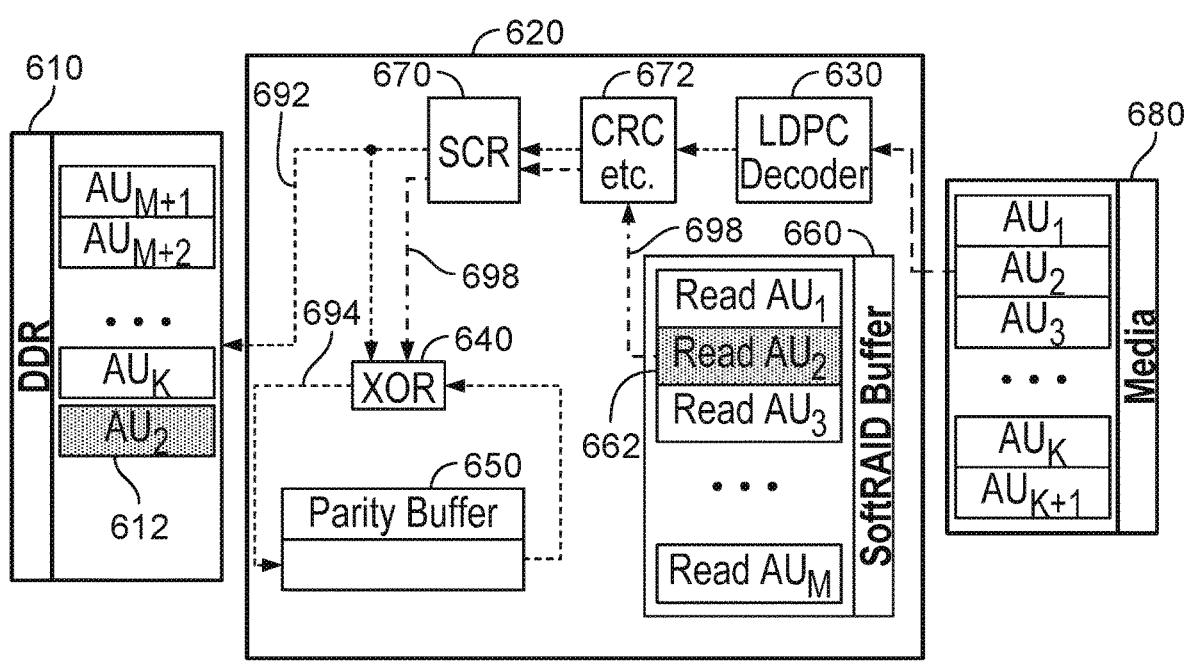

The decoding operation in FIGS. 6A-6E may be broken down into three phases: FIG. 6A illustrates Phase I of the decoding process; FIGS. 6B and 6C illustrate Phase II of the decoding process; FIG. 6D illustrates a possible modification of Phase II; and FIG. 6E illustrates an optional Phase III of the decoding process. As used previously in relation to FIG. 3, m denotes the designed maximum number of failed AUs that the coding system can recover, which can also be referred to as a predefined threshold.

FIG. 6A shows Phase I of an embodiment of the present disclosure in which exactly m failed AUs (denoted by $AU_1$, $AU_2, \ldots, AU_m$) are stored in softRAID buffer 660. Path 692 illustrates the scenario where a particular $AU_x$ (where x=1, 2, ..., k+1) is successfully decoded and returned to DDR 610; path 696 illustrates the scenario where the $AU_x$ has failed to decode by LDPC decoder 630.

Parity buffer 650 is reset prior to decoding the product code. LDPC decoder 630 retrieves hard-input data (i.e., previously encoded $AU_1, AU_2, \ldots, AU_{k-1}$) which are stored in media 680, via path 690, and attempts to decode them. For each previously encoded $AU_x$ that is successfully decoded by LDPC decoder 630, the recovered $AU_x$ data is stripped of its LDPC parity (e.g., row code parity data portion 112) by passing through optional circuitry 672 and 670, and transferred along path 692 to DDR 610. The recovered and descrambled $AU_x$ data (including its LDPC parity) may also be transferred to simple XOR block 640 to be XOR'ed and saved in parity buffer 650. For each previously encoded $AU_x$ that failed to be decoded, however, the original $AU_x$ hard-input data (as retrieved from media 680) is passed along path 696 to be stored in softRAID buffer 660. In addition, the original $AU_x$ is further processed by optional circuitry 672 and 670 before being fed into simple XOR block 640 to be XOR'ed and saved in parity buffer 650. The simple XOR block 640 and the parity buffer 650 work in a similar mechanism as simple XOR block 440 and parity buffer 450 do during the encoding process, in FIGS. 4A-4E: each incoming allocation unit $AU_x$ passes through path 694 to be XOR'ed with all previous AUs and the result is saved back to parity buffer 650.

The above process is repeated for each previously encoded $AU_x$ of media 680 during this phase of the decoding process (i.e., Phase I), such that failed $AU_1, AU_2, \ldots, AU_j$ are stored in softRAID buffer 660 and the remaining, successfully-decoded AU data, i.e., $AU_{m+1} \char`\^ AU_{m+2}, \ldots,$ $AU_k$, are stored in DDR 610. By the end of Phase I, parity buffer 650 would have stored the value of $AU_{k+1} \char`\^ AU_k \char`\^ \ldots$ $\char`\^ AU_1$, which corresponds to the XOR'ed value of all failed $AU_x$ and all successfully-decoded $AU_x$.

Thereafter, FIG. 6B shows Phase II of the decoding operation, which commences if the actual number of failed $AU_x$ is not greater than m. In other words, Phase II will be activated only if the actual number of decoding failures in Phase I does not exceed the predefined threshold number of failures that the coding system is designed to accommodate.

In the special case of a single failed $AU_1$ 662 in softRAID buffer 660, there is no need to invoke additional processing because the RAID architecture, as previously discussed in relation to FIG. 2, is capable of handling a single failed AU. In this scenario, the failed $AU_1$ 662 can be processed by optional circuitry 672 and 670, and rely on standard RAID recovery procedure to XOR the processed $AU_1$ 662 with the data stored in parity buffer 650 to obtain the recovered $AU_1$, at simple XOR block 640. The recovered $AU_1$ can then be stripped of its LDPC parity and transferred back to DDR 610, as restored $AU_1$ data 612. The illustration in FIG. 6B shows the above-described special case assuming that the failed AU is $AU_1$. However, it is understood by one skilled in the art that the disclosure is not limited to AU1, as any AU of the k+1 AUs as stored in media 680 may be the failed AU, which can easily be recovered by the process described above.

In the more general case in which the number of failed AUs is greater than one, but not greater than m, the coding system may initiate additional processing by configuring LDPC decoder 630 to consider soft information from parity buffer 650 in addition to the hard information (i.e., hard data bits) from the failed AUs as stored in softRAID buffer 660. LDPC decoder 630 may follow a set of decoding rules to further process the failed AUs, as is illustrated in FIG. 6C.

In particular, LDPC decoder 630 may decode previously encoded $AU_x$ as stored in media 680 in a similar manner as outlined in FIG. 6A and store the successfully decoded AUs (i.e., $AU_{m+1}, AU_{m+2}, \ldots, AU_k$), via path 692, in DDR 610. LDPC decoder 630 may additionally retrieve both hard information from softRAID buffer 660 and soft information from parity buffer 650 via paths 697. In some embodiments, the soft information from parity buffer 650 may indicate how reliable the hard information (i.e., the failed AUs stored in softRAID buffer 660) is. For example, LDPC decoder 630 may apply a two-bit input bit-flipping method with optimized decoding rules to decode the failed AUs. The bit-flipping method is disclosed in U.S. Patent Application Publication No. 2014/0229792, filed Feb. 4, 2014, published Aug. 14, 2014, which has been incorporated by reference in its entirety. In some embodiments, the soft information from parity buffer 650 may only contain user data bits of the LDPC codewords stored therein, as LDPC decoder 630 may have previously stripped out the parity bits.

Once LDPC decoder 630 has successfully recovered a failed AU, such as failed $AU_1$ in softRAID buffer 660, the recovered $AU_1$ data can be stripped of its parity data bits and transferred to DDR 610 in a similar manner as other successfully-decoded AUs were. In addition, the recovered $AU_1$ data can be XOR'ed at simple XOR block 640 and stored in parity buffer 650 to update the parity data in parity buffer 650. Here, the present invention provides for two implementations for updating parity buffer 650. In a simplified implementation ("Method 1"), parity buffer 650 is only updated once at the beginning of Phase II. This implementation saves power and processing cycles by limiting the number of buffer updates. In another implementation ("Method 2"), parity buffer 650 is updated each time LDPC decoder 630 successfully recovers a failed $AU_x$. The error vector, as computed by XOR'ing the recovered AU data and the read $AU_x$ data, can then be used to update parity buffer 650. This implementation can provide better performance metrics at the expense of higher power and system resource consumption. These performance comparisons are illustrated in relation to FIG. 10 below. Lastly, the list of failed AUs as stored in softRAID buffer 660 can be updated to remove $AU_1$.

FIG. 6D illustrates an extension of the Phase II decoding process of FIG. 6C. As illustrated in FIG. 6C, LDPC decoder 630 steps through the failed AUs (e.g., $AU_1, AU_2, \ldots, AU_m$) stored in softRAID buffer 660 in a serial fashion (i.e., sequentially stepping through the failed AUs one at a time). A complete iteration of all failed AUs is defined as an (outer) pass, in contrast with the (inner) passes that LDPC decoder 630 iteratively performs on the same failed AU, as part of the LDPC iterative decoding process. Although LDPC decoder 630 only attempts to recover the failed AUs in FIG. 6C in one (outer) pass, the coding system in FIG. 6D may subject any remaining failed AUs to multiple (outer) passes. In some embodiments, the multiple (out) passes may be carried out with different decoding rules. Each different decoding rule may help recover additional failed AUs, which, in turn, may update the soft information stored in parity buffer 650 to help with additional AU recovery.

In some embodiments, LDPC decoder 630 may have a mechanism to select one of the failed AUs from softRAID buffer 660 to be decoded first. For example, LDPC decoder 630 may select the failed AU based on an initial syndrome weight. In some other embodiments, the decoding rules of LDPC decoder 630 may be re-evaluated (e.g., changed or unchanged) once a failed AU is recovered. In still some other embodiments, the coding system may employ multiple LDPC decoders to process some of the failed AUs in a parallel fashion.

FIG. 6E illustrates an optional Phase III of the decoding process, which may be performed if any of the failed AUs in softRAID buffer 660 are still not successfully decoded even after Phase II has been completed. In some embodiments, these repeatedly failed AUs may be re-read from media 680. For example, during a re-read, the system firmware may change the voltage reference ($V_{ref}$) of a failed AU for the $V_{ref}$ of a successfully-decoded AU, because the latter is presumably of better quality. An adjusted $V_{ref}$ might, in some embodiments, result in a read that has fewer number of erroneous bits and, consequently, the LDPC decoder 630 might successfully decode. As another example, LDPC decoder 630 may issue multiple reads on the same failed AU in order to extract soft information for the failed AU.

If a previously-failed AU, such as failed $AU_2$ in softRAID buffer 660, is eventually recovered in Phase III, LDPC decoder should direct both the recovered $AU_2$ data (via path 692) and the failed $AU_2$ data (via path 698) to simple XOR block 640 in order for them to be XOR'ed. The XOR'ed data may update the soft information stored in parity buffer 650. With this updated soft information, Phase II may be reactivated to better decode other failed AUs.

As explained above, FIGS. 7A-7E illustrate a decoding process counterpart to the encoding process in FIGS. 5A-5E. The decoding operation in FIGS. 7A-7E is largely similar to the decoding operation in FIGS. 6A-6E, with the exception of parity buffer operation. In particular, the parity buffer operations in FIGS. 7A-7E are carried out prior to the descrambling processing in optional circuitry 770. As such, the data stored in parity buffer 750 contains both user data bits as well as LDPC parity bits.

Figure 7A:
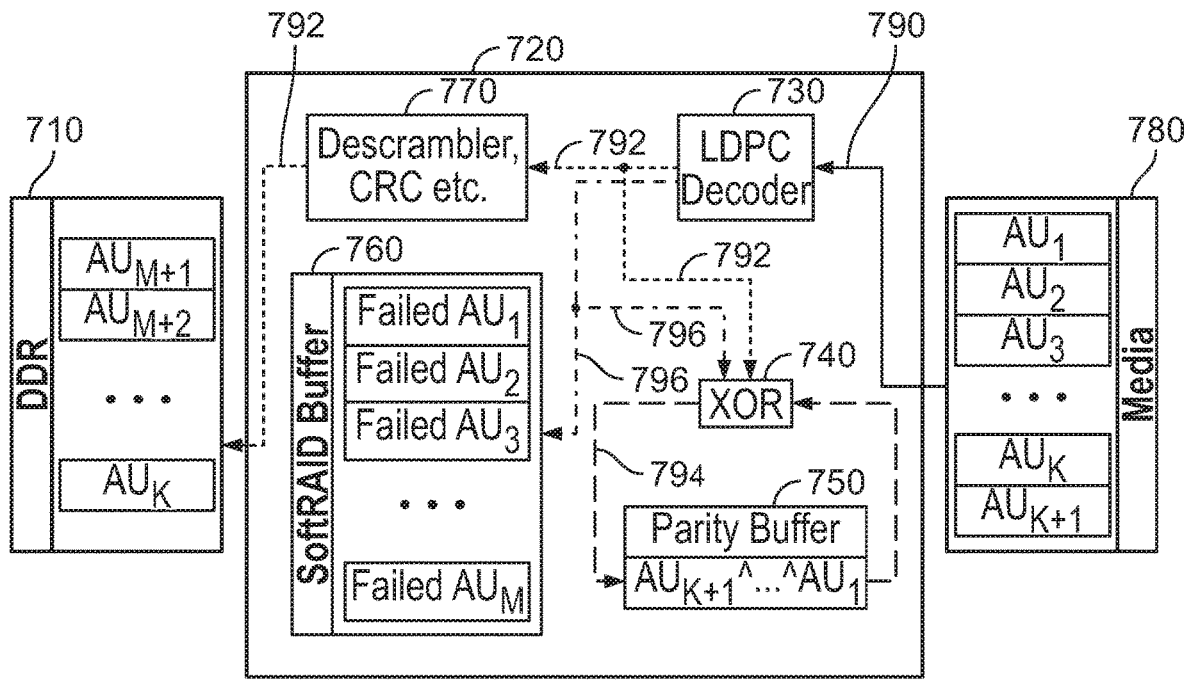
FIGS. 7A-7E show schematic representations of a coding system such as that of FIG. 3, which decodes codewords based on product codes in accordance with some other implementations of the subject matter of this disclosure.
Figure 7B:
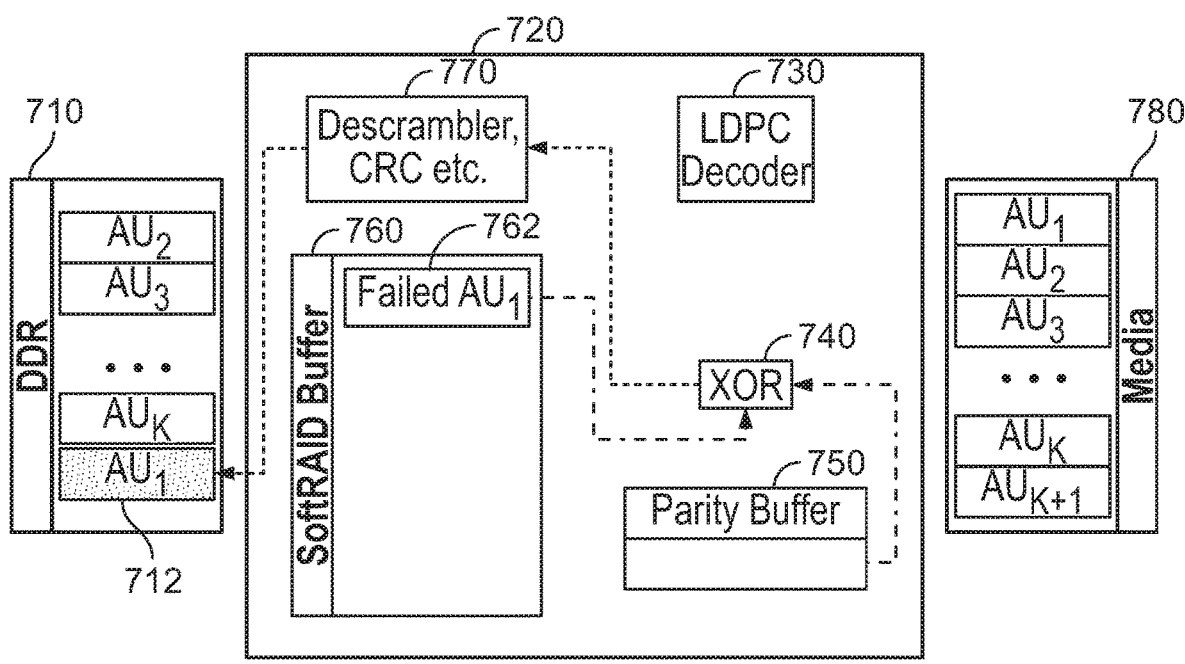
Figure 7C:
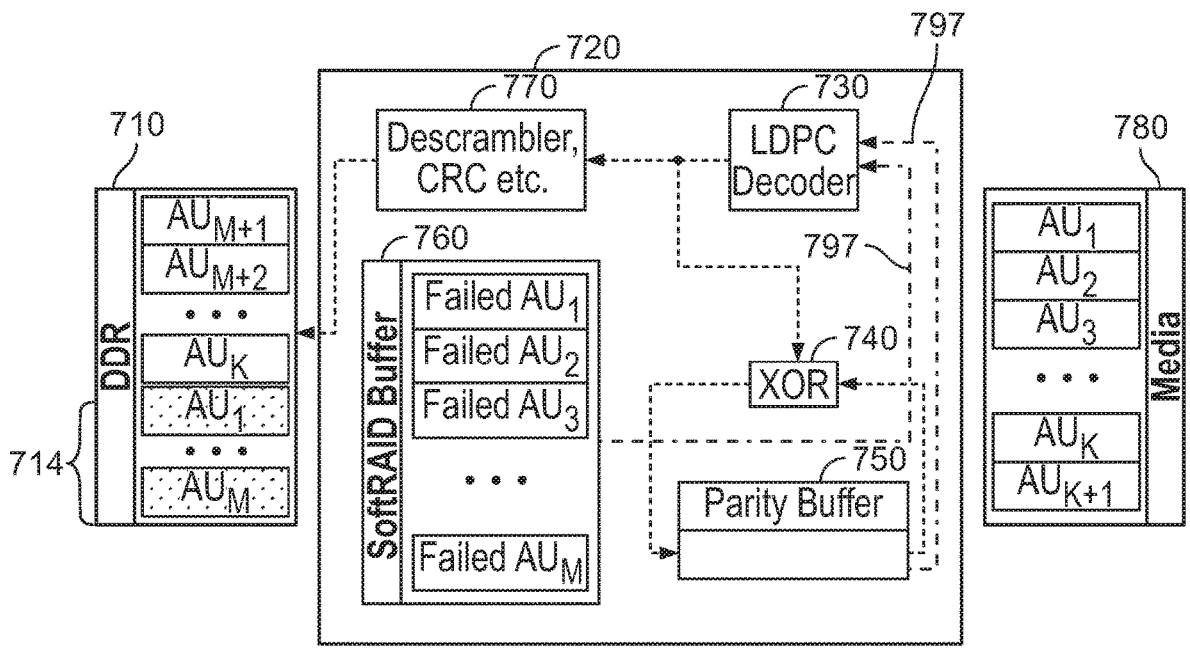
Figure 7D:
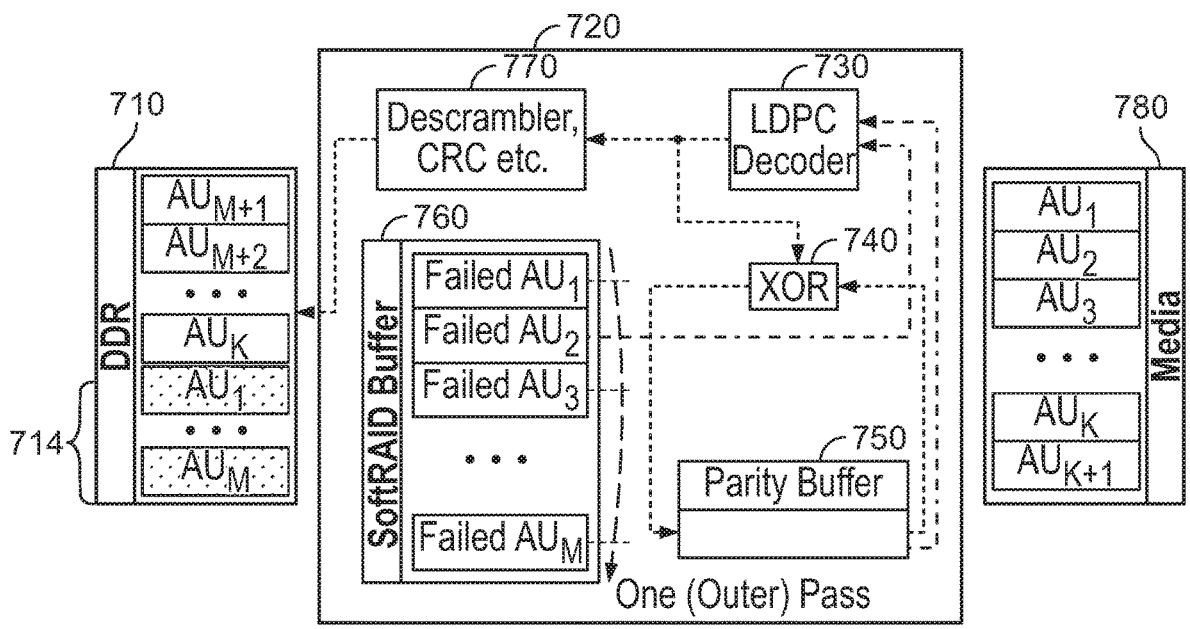
Figure 7E:
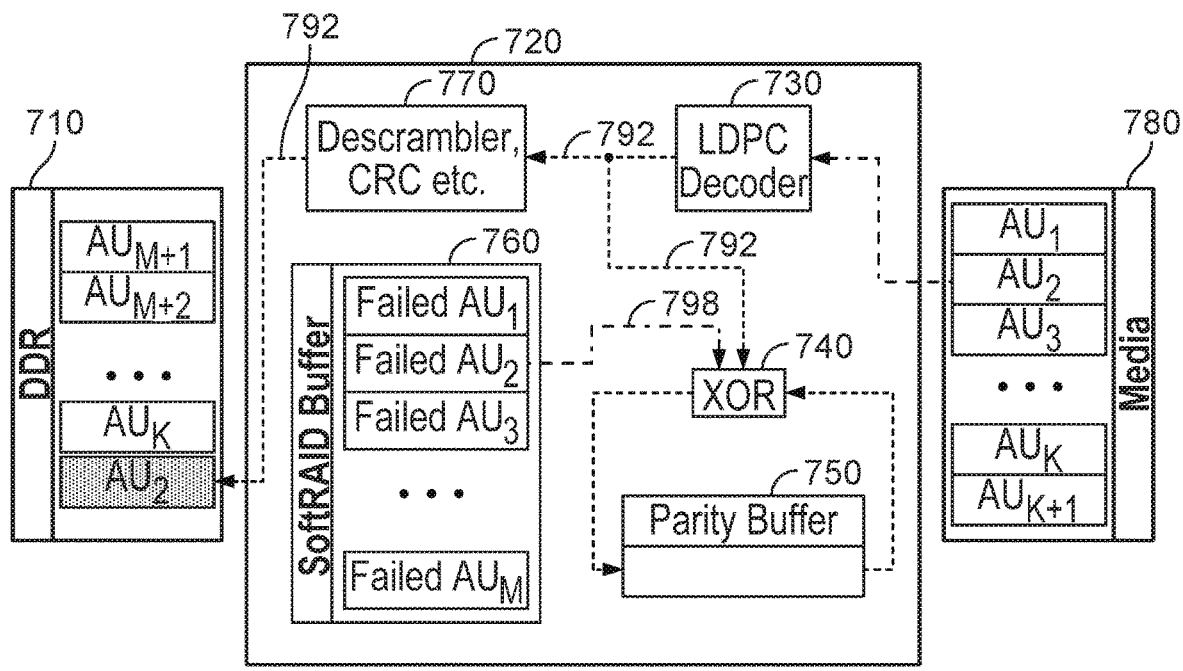

Similar to FIG. 6, the decoding process in FIGS. 7A-7E may be broken down into three phases: FIG. 7A illustrates Phase I of the decoding process; FIGS. 7B and 7C illustrate Phase II of the decoding process; FIG. 7D illustrates a possible modification of Phase II; and FIG. 7E illustrates an optional Phase III of the decoding process. As used previously, m denotes the designed maximum number of failed AUs that the coding system can recover.

FIG. 7A shows Phase I of an embodiment of the present disclosure in which exactly m failed AUs (denoted by $AU_1$, $AU_2$, . . . , $AU_m$) are stored in softRAID buffer 760. Parity buffer 750 is reset prior to decoding the product code. LDPC decoder 730 retrieves hard-input data (i.e., previously encoded $AU_1$, $AU_2$, . . . , $AU_{k+1}$) which are stored in media 780 via path 790, and attempts to decode them. For each previously encoded $AU_x$ (where x=1, 2, . . . , k+1) that is successfully decoded by LDPC decoder 730, the recovered $AU_x$ data is stripped of its LDPC parity (e.g., row code parity data portion 112) and transferred along path 792 to DDR 710 for further processing. The recovered $AU_x$ data (including its LDPC parity) may also be transferred to simple XOR block 740 to be XOR'ed and saved in parity buffer 750. For each previously encoded $AU_x$ that failed to be decoded, however, the original $AU_x$ hard-input data (as retrieved from media 780) is passed along path 796 to be stored in softRAID buffer 760, and to simple XOR block 740 to be XOR'ed and saved in parity buffer 750. The simple XOR block 740 and the parity buffer 750 work in a similar mechanism as simple XOR block 540 and parity buffer 550 do during the encoding process, in FIGS. 5A-5E: each incoming allocation unit $AU_x$ passes through path 794 to be XOR'ed with all previous AUs and the result is saved in parity buffer 750.

The above process is repeated for each previously encoded $AU_x$ of media 780 during this phase of the decoding process (i.e., Phase I), such that failed $AU_1$, $AU_2$, . . . , $AU_m$ are stored in softRAID buffer 760 and the remaining, successfully-decoded AU data, i.e., $AU_{m+1}$, $AU_{m+2}$, . . . , $AU_k$, are stored in DDR 710. By the end of Phase I, parity buffer 750 would have stored the value of $AU_{k+1}{\char`\^}AU_k{\char`\^}$ . . . ${\char`\^}AU_1$, which corresponds to the XOR'ed value of all failed $AU_x$ and all successfully-decoded $AU_x$.

Thereafter, FIG. 7B shows Phase II of the decoding operation, which commences if the actual number of failed $AU_x$ is not greater than m. In other words, Phase II will be activated if the actual number of decoding failures in Phase I does not exceed the threshold number of failures that the coding system is designed to accommodate.

In the special case of a single failed $AU_1$ 762 in softRAID buffer 760, there is no need to invoke additional processing because the RAID architecture, as previously discussed in relation to FIG. 2, is capable of handling a single failed AU. The standard RAID recovery procedure can simply XOR the failed $AU_1$ 762 with the data stored in parity buffer 750 to obtain the recovered $AU_1$, at simple XOR block 740. The recovered $AU_1$ can then be stripped of its LDPC parity and transferred back to DDR 710, as restored $AU_1$ data 712. The illustration in FIG. 7B shows the above-described special case assuming that the failed AU is $AU_1$. However, it is understood by one skilled in the art that the disclosure is not limited to AU1, as any AU of the k+1 AUs as stored in media 780 may be the failed AU, which can easily be recovered by the process described above.

In the more general case in which the number of failed AUs is greater than one, but not greater than m, the coding system may initiate additional processing by configuring LDPC decoder 730 to consider soft information from parity buffer 750 in addition to the hard information (i.e., hard data bits) from the failed AUs as stored in softRAID buffer 760. LDPC decoder 730 may follow a set of decoding rules to further process the failed AUs, as is illustrated in FIG. 7C.

In particular, LDPC decoder 730 may decode previously encoded $AU_x$ as stored in media 780 in a similar manner as outlined in FIG. 7A and store the successfully decoded AUs (i.e., $AU_{m+1}$, $AU_{m+2}$, . . . , $AU_k$), via path 792, in DDR 710. LDPC decoder 730 may additionally retrieve both hard information from softRAID buffer 760 and soft information from parity buffer 750 via paths 797. In some embodiments, the soft information from parity buffer 750 may indicate how reliable the hard information (i.e., the failed AUs stored in softRAID buffer 760) is. For example, LDPC decoder 730 may apply a two-bit input bit-flipping method with optimized decoding rules to decode the failed AUs. The bit-flipping method is disclosed in U.S. Patent Application Publication No. 2014/0229792, filed Feb. 4, 2014, published Aug. 14, 2014, which has been incorporated by reference in its entirety. In some embodiments, the soft information from parity buffer 750 may contain both user data bits and the parity bits of the LDPC codewords stored therein. This is a distinction from the decoding process illustrated in relation to FIGS. 6A-6E.

Once LDPC decoder 730 has successfully recovered a failed AU, such as failed $AU_1$ in softRAID buffer 760, the recovered $AU_1$ data can be stripped of its LDPC parity and transferred to DDR 710, in a similar manner as other successfully-decoded AUs were. In addition, the recovered $AU_1$ data, including its LDPC parity, can be XOR'ed at simple XOR block 740 and stored in parity buffer 750 to update the parity data in parity buffer 750. Lastly, the list of failed AUs as stored in softRAID buffer 760 can be updated to remove $AU_1$.

FIG. 7D illustrates an extension of the Phase II decoding process of FIG. 7C. As illustrated in FIG. 5C, LDPC decoder 730 steps through the failed AUs (e.g., $AU_1, AU_2, \ldots, AU_m$) stored in softRAID buffer 760 in a serial fashion (i.e., sequentially stepping through the failed AUs one at a time). A complete iteration of all failed AUs is defined as an (outer) pass, in contrast with the (inner) passes that LDPC decoder 730 iteratively performs on the same failed AU, as part of the LDPC iterative decoding process. Although LDPC decoder 730 only attempts to recover the failed AUs in FIG. 7C in one (outer) pass, the coding system in FIG. 7D may subject any remaining failed AUs to multiple (outer) passes. In some embodiments, the multiple (out) passes may be carried out with different decoding rules. Each different decoding rule may help recover additional failed AUs, which, in turn, may update the soft information stored in parity buffer 750 to help with additional AU recovery.

In some embodiments, LDPC decoder 730 may have a mechanism to select one of the failed AUs from softRAID buffer 760 to be decoded first. For example, LDPC decoder 730 may select the failed AU based on an initial syndrome weight. In some other embodiments, the decoding rules of LDPC decoder 730 may be re-evaluated (e.g., changed or unchanged) once a failed AU is recovered. In still some other embodiments, the coding system may employ multiple LDPC decoders to process some of the failed AUs in a parallel fashion.

FIG. 7E illustrates an optional Phase III of the decoding process, which may be performed if any of the failed AUs in softRAID buffer 760 are still not successfully decoded even after Phase II has been completed. In some embodiments, these repeatedly failed AUs may be re-read from media 780. For example, during a re-read, LDPC decoder may change the voltage reference ($V_{ref}$) of a failed AU for the $V_{ref}$ of a successfully-decoded AU, because the latter is presumably of better quality. An adjusted $V_{ref}$ might, in some embodiments, result in a read that has fewer number of erroneous bits and, consequently, the LDPC decoder 730 might successfully decode. As another example, LDPC decoder 730 may issue multiple reads on the same failed AU in order to extract soft information for the failed AU.

If a previously-failed AU, such as failed $AU_2$ in softRAID buffer 760, is eventually recovered in Phase III, LDPC decoder should direct both the recovered $AU_2$ data (via path 792) and the failed $AU_2$ data (via path 798) to simple XOR block 740 in order for them to be XOR'ed. The XOR'ed data may update the soft information stored in parity buffer 750. With this updated soft information, Phase II may be reactivated to better decode other failed AUs.

The encoding and decoding processes described above significantly reduces the RAID stripe failure rate of known systems. In particular, in the first scheme (i.e., the encoding process illustrated in FIGS. 4A-4E and decoding process illustrated in FIGS. 6A-6E) allows softRAID block to share several options with existing standard RAID hardware, and is therefore easier to implement. The second scheme (i.e., the encoding process illustrated in FIGS. 5A-5E and the decoding process illustrated in FIGS. 7A-7E) may offer certain performance advantages because the soft information stored in the parity buffers are computed on both the user data and the LDPC parity data.

To evaluate the performance of these processes, it is assumed that a single LDPC codeword (2 KiB code length, code rate=0.9) is used to encode each AU. In practice, as illustrated before, each AU may contain one or more codewords. In addition, it is assumed that the m failed AUs observe the same bad signal-to-noise ratio (SNR) of a noisy channel, whereas the remaining AUs observe a good SNR with no failures. In other words, the maximum number of failed AUs is limited to m. It is understood that the performance evaluation herein is for illustration purpose, and other encoding schemes and assumptions about channel conditions may be applied to the present disclosure.

Figure 8:
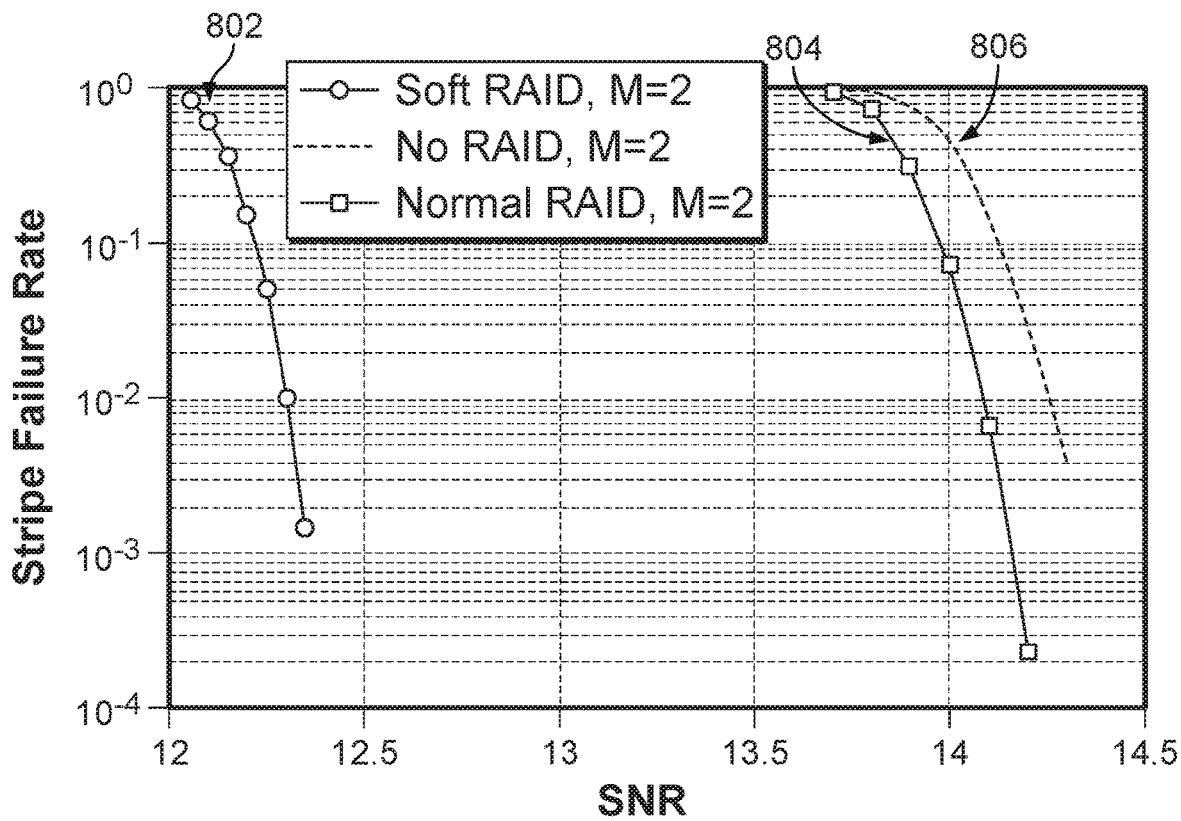
FIG. 8 shows a plot which evaluates the performance of a coding system in accordance with some implementations of the subject matter of this disclosure.

FIG. 8 shows a plot which evaluates the performance of a coding system as described herein in accordance with some embodiments of the present disclosure, where m=2, i.e., there are exactly two AUs in a RAID stripe that observe bad SNR. Plots 802, 804, and 806 are plotted for stripe failure rate (also known as the product codeword failure rate) against the bad SNR of the present solution (i.e., the softRAID system), a normal RAID architecture, and a no-RAID system, respectively. Plot 806 indicates that, in the absence of any RAID implementations, the stripe fails if there is one or more failed AUs. Plot 804 indicates stripe failure for any number of AU failures greater than one, which is consistent with the analysis discussed above, in relation to FIG. 2. Plot 802 illustrates the present disclosure, which can recover more than 1 failed AUs.

Figure 9:
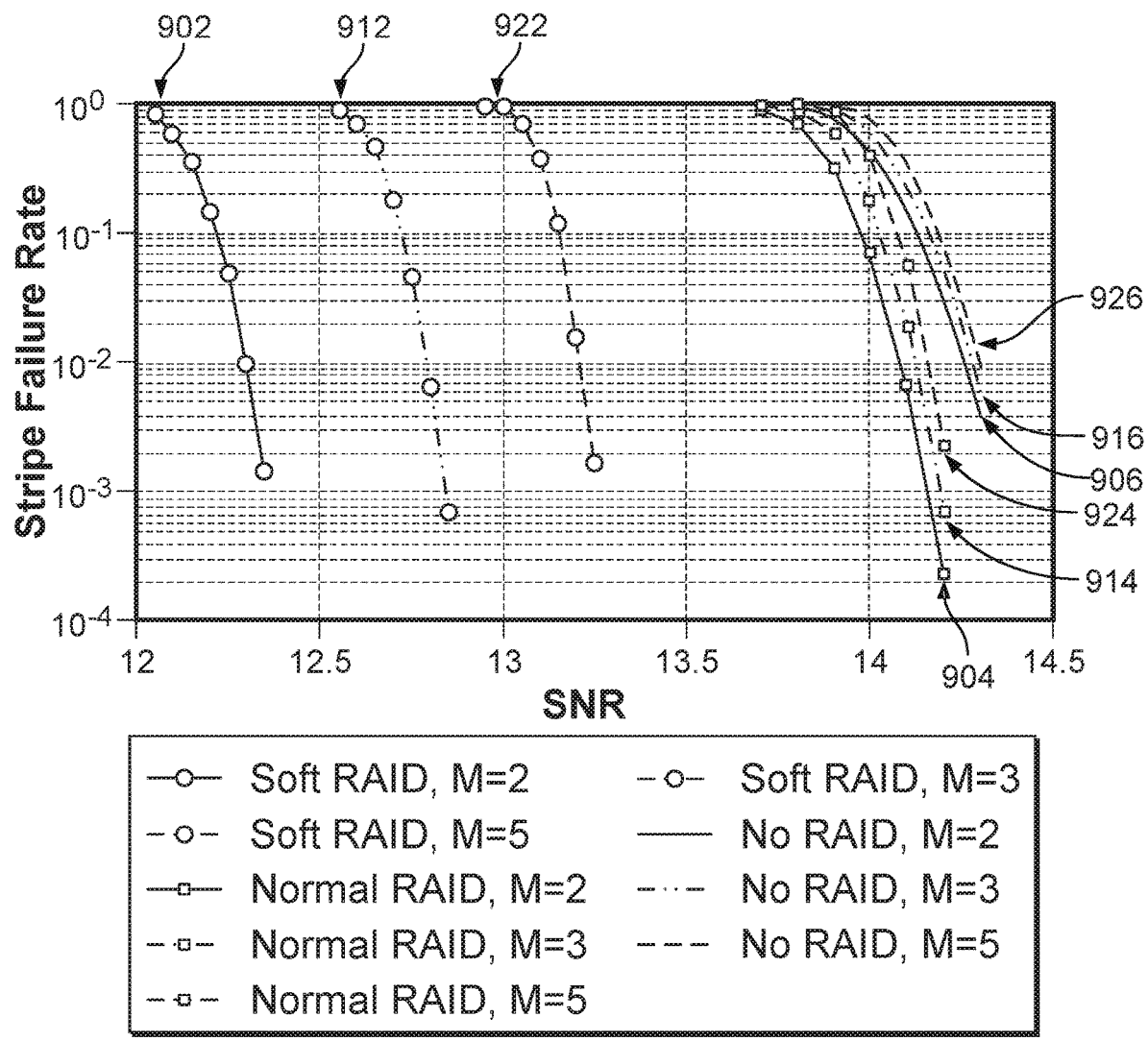
FIG. 9 shows another plot which evaluates the performance of a coding system in accordance with some other implementations of the subject matter of this disclosure.

Comparing Plot 802 against Plots 804 and 806 along the horizontal SNR axis, it can be observed that a coding system implementing the present disclosure (i.e., softRAID) can accommodate a noisier channel (one having a lower SNR) than a regular RAID or no-RAID system at any given stripe failure rate. The performance improvement of the coding system discussed herein is more evident as different channel conditions (reflected by different values of m) are considered, as shown in FIG. 9 in accordance with some embodiments of the present disclosure, where plots of m=2, m=3, and m=5 (each, as before, representing the exact number of AUs observing bad SNR) are presented together.

In particular, plots 906, 916, and 926 represent the stripe failure rates of a no-RAID system under successively worsening channel conditions (i.e., m=2, 3, and 5, respectively); and plots 904, 914, and 924 represent the stripe failure rate of a normal RAID system under those conditions. Again, along the horizontal SNR axis, the softRAID plots of the present disclosure, i.e., Plots 902, 912, and 922, are able to accommodate channel conditions with much lower SNR than the regular RAID plots and the no-RAID plots, at any given stripe failure rate.

Figure 10:
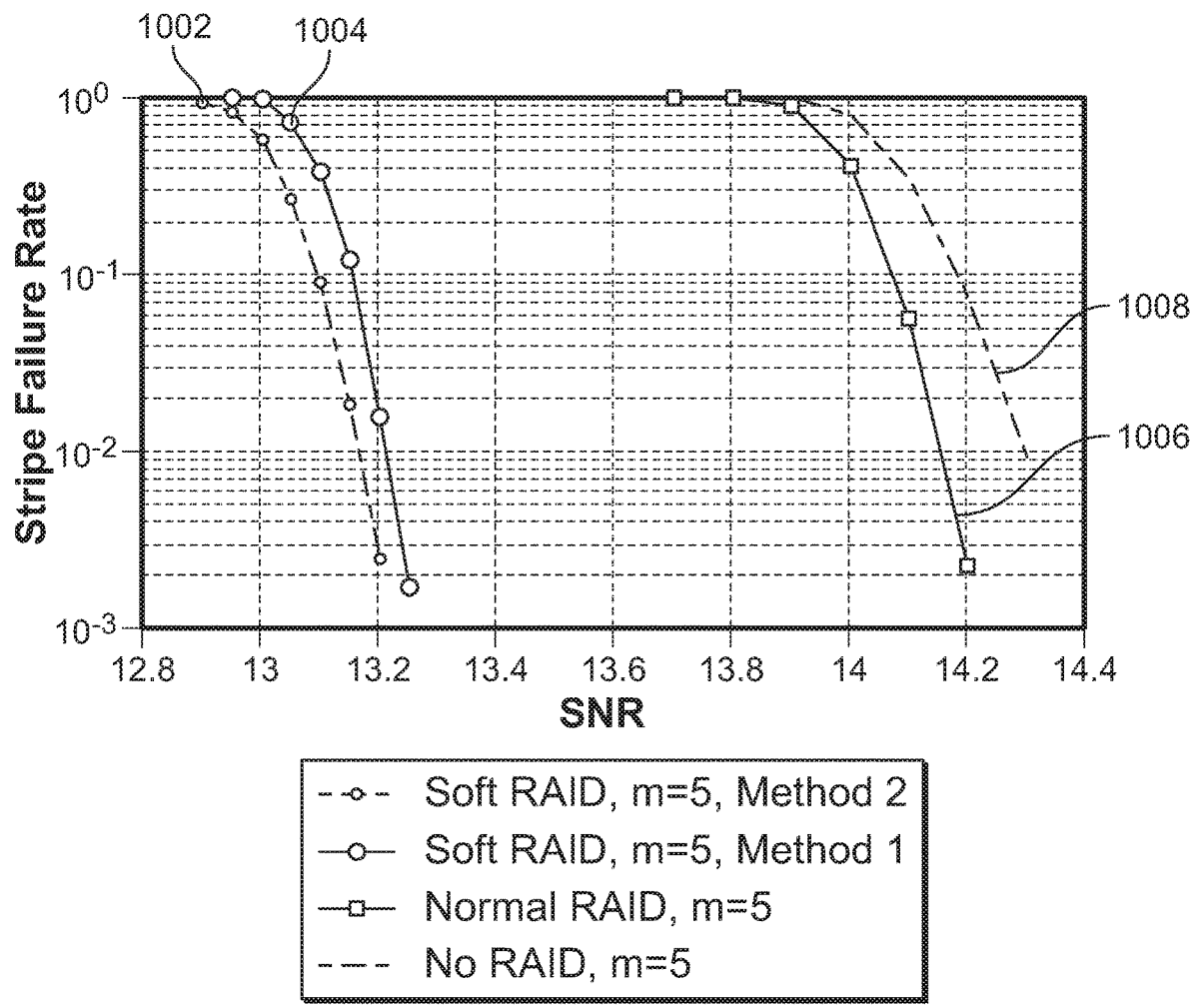
FIG. 10 shows a further plot which evaluates the performance of a coding system in accordance with some further implementations of the subject matter of this disclosure.

FIG. 10 shows a plot which evaluates the performance of a coding system as described herein in accordance with some embodiments of the present disclosure, where m=5 for systems implementing no RAID at all, a normal RAID system, and the proposed softRAID methods as described in the present invention. In particular, Plot 1004 corresponds to Method 1 and Plot 1002 corresponds to Method 2 as described in relation to the decoding process in FIGS. 6A-6E. Plots 1006 and 1008 show performance evaluations of systems implementing a normal RAID and no RAID, respectively. As can be seen from FIG. 10, systems implementing a soft RAID, using Method 2, offers the best performance improvement, with the lowest Stripe Failure Rate at any given channel SNR. However, as previously noted in relation to FIG. 6C, the improved performance metrics of Method 2 are built at the expense of using more system resources.

It will be understood that the foregoing is only illustrative of the principles of the disclosure, and that the disclosure can be practiced by other than the described embodiments, which are presented for purposes of illustration and not of limitation, and the present disclosure is limited only by the claims which follow.

What is claimed is:

1. A method for recovering memory failure when decoding codewords encoded by a product code from a memory, the method comprising:
retrieving, from a first memory section of the memory, for decoding, a plurality of codewords encoded by a first code of the product code;
for each codeword from the plurality of codewords, storing, at a buffer the respective codeword and soft information relating to a decoding process of the respective codeword when the respective codeword failed to be decoded by a decoder;
determining if a first count of the codewords that failed to be decoded by the decoder exceeds a predefined threshold indicative of a predefined number of codewords that the decoder can recover;
in response to determining that the first count does not exceed the predefined threshold:
retrieving, from the buffer, the stored codewords that failed to be decoded by the decoder and the soft information relating to the respective decoding process of each codeword;
iteratively decoding, by the same decoder, the stored codewords that failed to be decoded by reusing buffered soft information; and
transmitting the iteratively decoded codewords from the decoder to a second memory section of the memory.

2. The method of claim 1, wherein the buffered soft information is updated based on a second code of the product code.

3. The method of claim 2, wherein the buffered soft information is updated each time one of the plurality of codewords is successfully decoded.

4. The method of claim 2, wherein the buffered soft information is updated only once at the beginning of the iterative processing of the plurality of codewords.

5. The method of claim 1, further comprising:
successfully decoding at least one of the stored codewords that has been iteratively processed to produce a decoded codeword; and
updating the buffered soft information with at least one of the stored codewords that has been iteratively processed.

6. The method of claim 5, further comprising updating the buffered soft information with the decoded codeword.

7. The method of claim 5, wherein at least one of the stored codewords that has been iteratively processed is successfully decoded based on a decoding rule.

8. The method of claim 7, further comprising attempting to decode subsequent codewords of the stored codewords that has been iteratively processed based on the decoding rule.

9. The method of claim 1, wherein the each failed codeword of the stored codewords is iteratively processed in a serial fashion.

10. The method of claim 1, further comprising:
determining a second count of failed codewords that failed to be decoded after one complete iteration of the plurality of codewords;
iteratively processing each failed codeword of the second count of failed codewords with the buffered soft information; and
attempting to decode each processed codeword of the second count of failed codewords.

11. The method of claim 1, wherein the predefined threshold is a designed maximum number of failures recoverable with the method of decoding.

12. A system for recovering memory failure when decoding codewords encoded by a product code from a memory, the system comprising:
a decoder configured to retrieve, from a first memory section of the memory, the plurality of codewords encoded by a first code of the product code; the system further comprising:
for each codeword from the plurality of codewords, a buffer configured to store the respective codeword and soft information relating to a decoding process of the respective codeword when the respective codewords failed to be decoded by a decoder;
the decoder being further configured to:
determine if a first count of the codewords that failed to be decoded by the decoder exceeds a predefined threshold indicative of a maximum number of codewords that the decoder can recover;
in response to determining that the first count does not exceed the predefined threshold:
retrieve, from the buffer, the stored codewords that failed to be decoded by the decoder and the soft information relating to the respective decoding process of each codeword;
iteratively decode, by the same decoder, the stored codewords that failed to be decoded, by reusing the soft information; and
transmit the iteratively decoded codewords from the decoder to a second memory section of the memory.

13. The system of claim 12, wherein the soft information is updated based on a second code of the product code.

14. The system of claim 13, wherein the soft information is updated each time one of the plurality of codewords is successfully decoded.

15. The system of claim 13, wherein the soft information is updated only once at the beginning of the iterative processing of the plurality of codewords.

16. The system of claim 12, wherein the decoder is further configured to:
successfully decode at least one of the saved codewords that has been iteratively processed to produce a decoded codeword; and
update the soft information with at least one of the saved codewords that has been iteratively processed.

17. The system of claim 16, wherein the decoder is further configured to update the soft information with the decoded codeword.

18. The system of claim 16, wherein at least one of the saved codewords that has been iteratively processed is successfully decoded based on a decoding rule.

19. The system of claim 18, wherein the decoder is further configured to attempt to decode subsequent codewords of the saved codewords that has been iteratively processed based on the decoding rule.

20. The system of claim 12, wherein the each failed codeword of the at least one failed codeword is iteratively processed in a serial fashion.

21. The system of claim 12, wherein the decoder is further configured to:
determine a second count of failed codewords that failed to be decoded after one complete iteration of the plurality of codewords;
iteratively process each failed codeword of the second count of failed codewords with the soft information; and attempt to decode each processed codeword of the second count of failed codewords.

22. The system of claim 12, wherein the predefined threshold is a designed maximum number of failures recoverable with the method of decoding.

\* \* \* \* \*